United States Patent [19]
Engelsberg

[11] Patent Number: 5,821,175
[45] Date of Patent: Oct. 13, 1998

[54] REMOVAL OF SURFACE CONTAMINANTS BY IRRADIATION USING VARIOUS METHODS TO ACHIEVE DESIRED INERT GAS FLOW OVER TREATED SURFACE

[75] Inventor: Audrey C. Engelsberg, Milton, Vt.

[73] Assignee: Cauldron Limited Partnership, Bethesda, Md.

[21] Appl. No.: 335,258

[22] Filed: Nov. 9, 1994

Related U.S. Application Data

[63] Continuation of Ser. No. 045,165, Apr. 12, 1993, abandoned, which is a continuation-in-part of Ser. No. 865,039, Mar. 31, 1992, abandoned, which is a continuation-in-part of Ser. No. 611,198, Nov. 9, 1990, Pat. No. 5,099,557, which is a division of Ser. No. 216,903, Jul. 8, 1988, Pat. No. 5,024,968.

[51] Int. Cl.$^6$ ........................................ B08B 3/12
[52] U.S. Cl. ........................... 438/795; 438/906; 134/1.3; 134/1
[58] Field of Search .............................. 134/1.3, 1, 105; 437/173, 946; 29/25.01; 250/492.1, 492.2; 438/295, 906, 796, 798

[56] References Cited

U.S. PATENT DOCUMENTS

| | | | |
|---|---|---|---|
| 3,364,087 | 1/1968 | Solomon et al. | 156/4 |
| 3,464,534 | 9/1969 | Muncheryan | 197/181 |
| 3,503,804 | 3/1970 | Schneider | 134/1 |

(List continued on next page.)

FOREIGN PATENT DOCUMENTS

| | | | |
|---|---|---|---|
| 0 091 646 | 10/1983 | European Pat. Off. . | |
| 0233755 | 8/1986 | European Pat. Off. . | |
| 268301 | 5/1988 | European Pat. Off. | 250/429.1 |
| 297506 | 1/1989 | European Pat. Off. . | |
| 0350021 | 1/1990 | European Pat. Off. . | |
| 0380387 | 8/1990 | European Pat. Off. . | |
| 3904969 | 9/1989 | Germany . | |
| 55-15620 | 2/1980 | Japan . | |
| 56-7439 | 1/1981 | Japan . | |
| 56-23748 | 3/1981 | Japan . | |
| 57-76846 | 5/1982 | Japan . | |
| 57-102229 | 6/1982 | Japan . | |
| 57-187936 | 11/1982 | Japan . | |
| 59-215728 | 12/1984 | Japan . | |
| 60-37736 | 2/1985 | Japan . | |
| 60-129136 | 7/1985 | Japan . | |
| 60-130126 | 7/1985 | Japan . | |
| 61119028 | 6/1986 | Japan . | |
| 61-147988 | 7/1986 | Japan . | |
| 63-178845 | 7/1988 | Japan . | |
| 4-157088 | 5/1992 | Japan . | |
| 5013346 | 1/1993 | Japan . | |
| 5179447 | 7/1993 | Japan . | |
| 83/01400 | 4/1983 | WIPO . | |

OTHER PUBLICATIONS

Lu, Y–F et al., "Laser Cleaning —A New Surface Cleaning Method Without Pollutions," *Mat. Res. Soc. Symp. Proc.*, vol. 344 (1994), pp. 329–334 (presented at the Materials Research Society Spring Symposium, San Francisco, CA, Apr. 5–7, 1994.

Lu, Y–F et al., "Laser–Induced Dry Cleaning in Air —A New Surface Cleaning Technology in Lieu of Carbon Fluorochloride (CFC) Solvents," *Jpn. J. Appl. Phys.*, vol. 33 (1994), Part 2, No. 3B, 15 Mar. 1994, pp. L430–L433.

(List continued on next page.)

*Primary Examiner*—Charles L. Bowers, Jr.
*Assistant Examiner*—Matthew Whipple
*Attorney, Agent, or Firm*—Morgan, Lewis & Bockius LLP; C. Scott Talbot; Robert J. Goodell

[57] ABSTRACT

An apparatus and method for removing surface contaminants from a surface of a substrate provides a laminar flow of inert gas over the substrate surface while irradiating the substrate. The invention enables removal of surface contaminants without altering the underlying molecular crystal structure of the substrate. The source of high-energy irradiation includes a pulsed or continuous wave laser or high-energy lamp.

9 Claims, 28 Drawing Sheets

U.S. PATENT DOCUMENTS

| | | | |
|---|---|---|---|
| 3,603,284 | 9/1971 | Garnache | 118/48 |
| 3,699,298 | 10/1972 | Briody | 118/725 |
| 3,805,736 | 4/1974 | Fuehring et al. | 118/49 |
| 3,845,738 | 11/1974 | Berkman | 118/725 |
| 4,160,166 | 7/1979 | Etienne et al. | 250/423 |
| 4,181,538 | 1/1980 | Narayan et al. | 148/1.5 |
| 4,292,093 | 9/1981 | Ownby et al. | 148/4 |
| 4,305,973 | 12/1981 | Yaron et al. | 427/35 |
| 4,393,311 | 7/1983 | Feldman et al. | 250/459.1 |
| 4,558,660 | 12/1985 | Nishrawa et al. | 118/725 |
| 4,568,632 | 2/1986 | Blum | 250/492.1 |
| 4,588,610 | 5/1986 | Yamazaki | 427/54.1 |
| 4,668,304 | 5/1987 | Schachameyer et al. | 148/1.5 |
| 4,680,616 | 7/1987 | Delahoy et al. | 357/59 |
| 4,687,539 | 8/1987 | Burns et al. | 156/626 |
| 4,731,516 | 3/1988 | Noguchi et al. | 219/121 |
| 4,752,668 | 6/1988 | Rosenfield et al. | 219/121 |
| 4,756,765 | 7/1988 | Woodroffe | 134/1 |
| 4,782,029 | 11/1988 | Takemura et al. | 437/11 |
| 4,920,994 | 5/1990 | Nachbar | 134/1 |
| 4,979,180 | 12/1990 | Muncheryan | 372/92 |
| 4,987,286 | 1/1991 | Allen | 219/121.68 |
| 4,993,360 | 2/1991 | Nakamurt | 118/715 |
| 5,024,968 | 6/1991 | Englesberg | 134/1 |
| 5,099,557 | 3/1992 | Engelsberg | 29/25.01 |
| 5,127,574 | 7/1992 | Mosser et al. | 48/115.2 |
| 5,151,134 | 9/1992 | Boquillon et al. | 134/1 |
| 5,151,135 | 9/1992 | Magee et al. | 134/1 |
| 5,221,556 | 6/1993 | Hawkins et al. | 118/715 |
| 5,228,206 | 7/1993 | Grant et al. | 34/1 |
| 5,238,499 | 8/1993 | Van De Van et al. | 118/724 |
| 5,314,538 | 5/1994 | Maeda et al. | 118/715 |
| 5,370,738 | 12/1994 | Watanabe et al. | 118/725 |
| 5,373,140 | 12/1994 | Nagy et al. | 219/121.85 |
| 5,531,857 | 7/1996 | Englesberg et al. | 156/345 |

OTHER PUBLICATIONS

Lu, Y–F et al., "Laser–Induced Removal of Fingerprints from Glass and Quartz Surfaces," *Jpn. J. Appl. Phys.*, vol. 33 (1994), Part 1, No. 8, Aug. 1994, pp. 4691–4696.

Shulyakovsky, A.Ye. et al., "Silicon Substrate Cleaning Processes in the Manufacture of Semiconductor Devices" (based on Soviet and foreign publications from 1970 to 1983), *Ministry of the Electronics Industry of the USSR—Surveys in Electronics*, Series 2. Semiconductor Devices—No. 2 91016), Central Electronics Research Institute (M.A. Vernikov, ed.) (1984).

Bollinger, L.D. et al., "Plasma Process Integration For Large Wafer Manufacturing," presented at the Advanced Semiconductor Manufacturing Conference, Cambridge, MA, Nov. 14, 1994.

Lovoi, Paul, "Laser paint stripping offers control and flexibility," *LASER FOCUS WORLD*, Nov. 1994, pp. 75–80.

Lu, Y–F et al., "Excimer–Laser Removal of $SiO_2$ Patterns from GaAs Substrates," *Jpn. J. Appl. Phys.*, vol. 33 (1994), Part 2, No. 3A, 1 Mar. 1994, pp. L324–L327.

Imen et al., "Laser–omited micro scale Particle removal," Appl. Phys. Lett. 58(2), 14 Jan. 1991, pp. 203–205.

Zehner et al., "Preparation of Atomically Clean Surfaces by Pulsed Laser Irradiation," *Appl. Phys. Lett.*, 36(1), (Jan. 1, 1980), 56–59.

McKinley et al., "Atomically Clean Semiconductor Surfaces Prepared by Laser Irradiation," *J. Phys. D: Appl. Phys.*, 13, (1980), L193–197.

Burmudez, "Changes in the Surface Composition of Si, $TiO_2$ and $SiO_2$ Induced by Pulsed Ruby–Laser Irradiation, " *J. Vac. Sci. Technol.*, 20(1), (Jan. 1982), 51–57.

Jellison et al., "Time–Resolved Elipsometry," *Applied Optics*, vol. 24, No. 17, (Sep. 1, 1985), 2948–2955.

Bedair et al., "Atomically Clean Surfaces by Pulsed Laser Bombardment," *Jnl. of Appl. Physics*, vol. 40, No. 12, (Nov. 1969), 4776–4781.

Lazzarini, "Lasers for the Cleaning of Statuary: Initial Results and Potentialities," *J. Vac. Sci. Tech.*, vol. 10, No. 6, (Nov. 12, 1973), 1039–1043.

Zehner et al., "Surface Studies of Laser Annealed Semiconductors," *Laser–Solid Interactions and Transient Thermal Processing of Materials*, Narayan, Brown, and Lemons, eds., Elsevier Science Publishing Co., Inc., (1983), 317–328.

Zehner et al., "Silicon Surface Structure and Surface Impurities After Pulsed Laser Annealing," *Laser and Electron Beam Processing of Materials*, C.W. White and P.S. Peercy, eds., Academic Press, Inc. (1980), 201–207.

Dulcey et al., "Deep UV Photochemistry of Chemisorbed Monolayers: Patterned Coplanar Molecular Assemblies," *Science*, vol. 252, (Apr. 26, 1991), 551–554.

Ross, "Dust Busters: Lasers Wipe Submicron Motes From Silicon Wafers," *Science American*, (Jun. 1990), 86, 88.

Zapka et al., "Efficient Pulsed Laser Removal of 0.2 $\mu$m Sized Particles From A Solid Surface," *Applied Phys. Lett.*, 58(20), (May 20, 1991), 2217–2219.

Lewis, "Lasers: A Cure For Dentaphobia?" *Photonics Spectra*, (Apr. 1992), 74–75.

Pettit, "Lasers Take Up Residence in the Surgical Suite," *IEEE Circuits and Devices*, (May 1992), 17–25.

May, "Expanding Laser Applications Foster Technological Evolution," *Photonics Spectra*, (Nov. 1991), 96–104, 106.

Saes getters advertisement in "Microcontamination", vol. 7, No. 6, Jun. 1989, p. 23.

Shen, Y., "Laser Manipulation of Paticles," *The Principles of Nonlinear Optics*, Chapter 20, 1984, pp. 367–378.

Magee et al., "Technology Disclosure: UV Laser Cleaning of Semiconductor Surfaces," XMR Inc., Santa Clara, CA.

Sowell, R., et al., "Surface Cleaning by Ultraviolet Radiation," *J. Vac. Sci. Technol.*, vol. 11, No. 1, Jan/Feb. 1974, pp. 474–475.

Mattox, D., "Surface Cleaning in Thin Film Technology," Sandia Laboratories, Albuquerque, N. M., 1975.

Fisher, W., "Equipment Cleaning to Minimize Particle Deposition," *Particle Control for Semiconductor Manufacturing*, Chapt. 24, pp. 415–428, 1990.

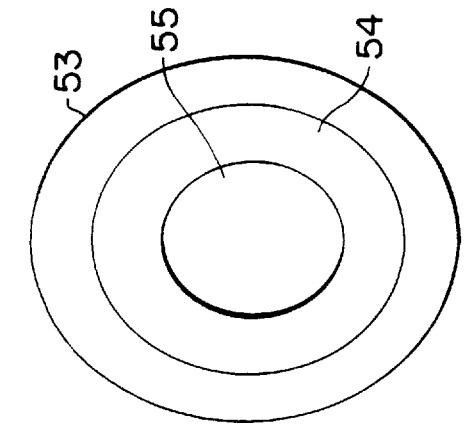
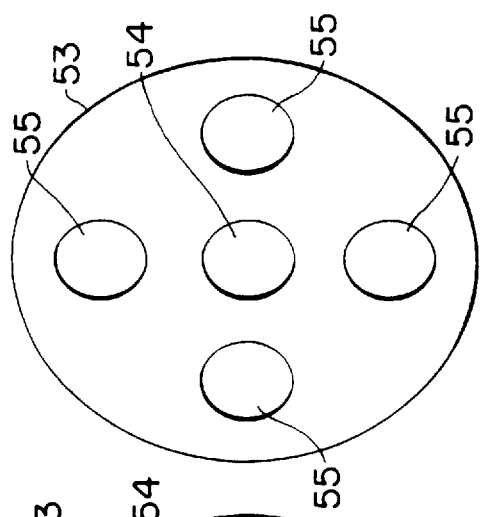
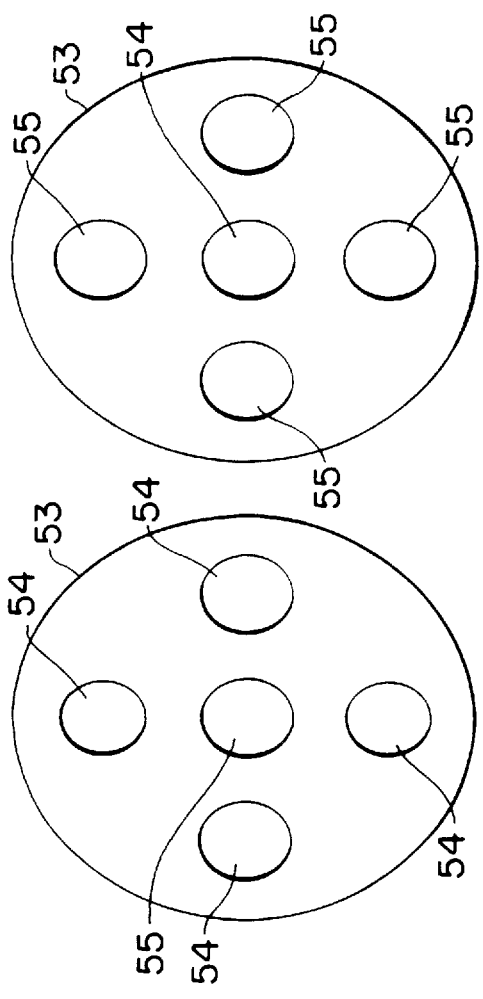
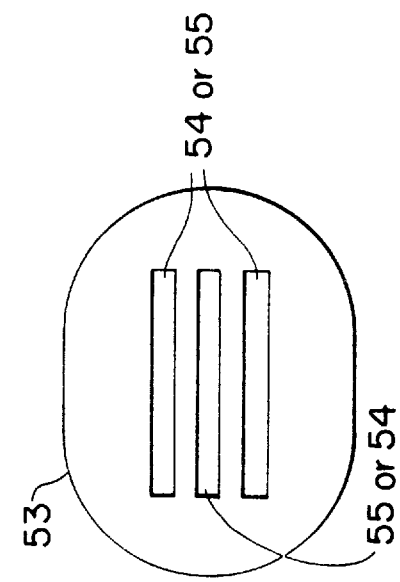
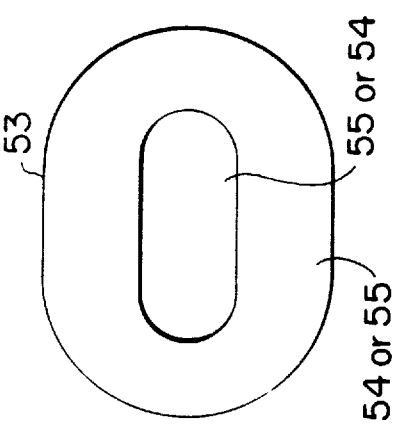
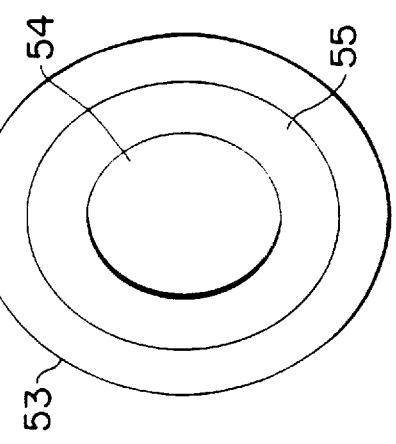

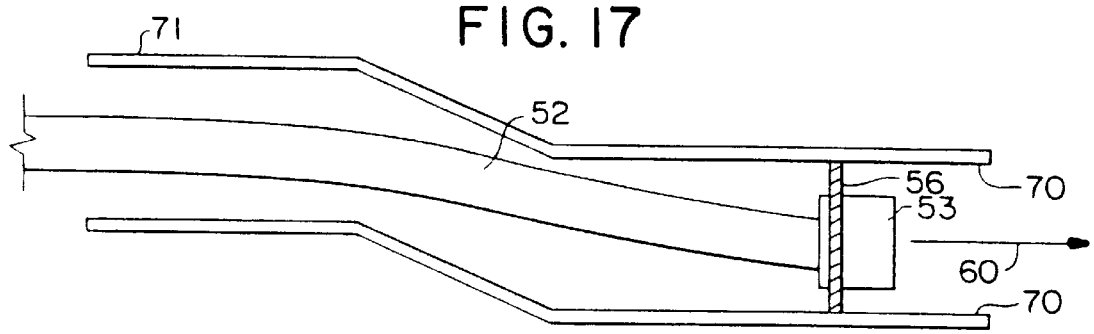
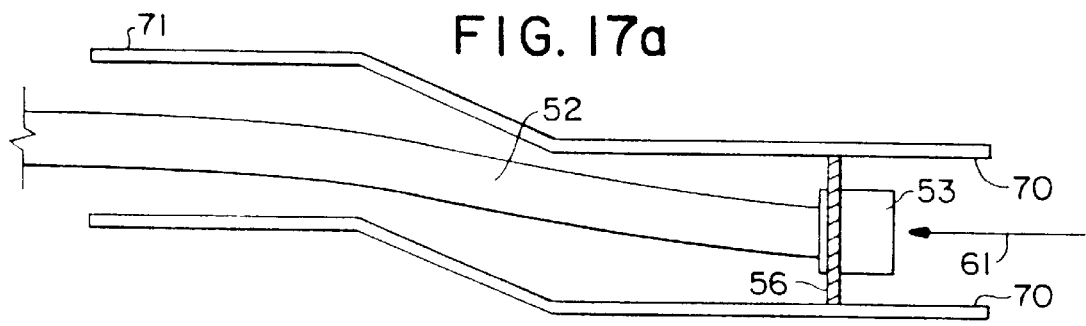

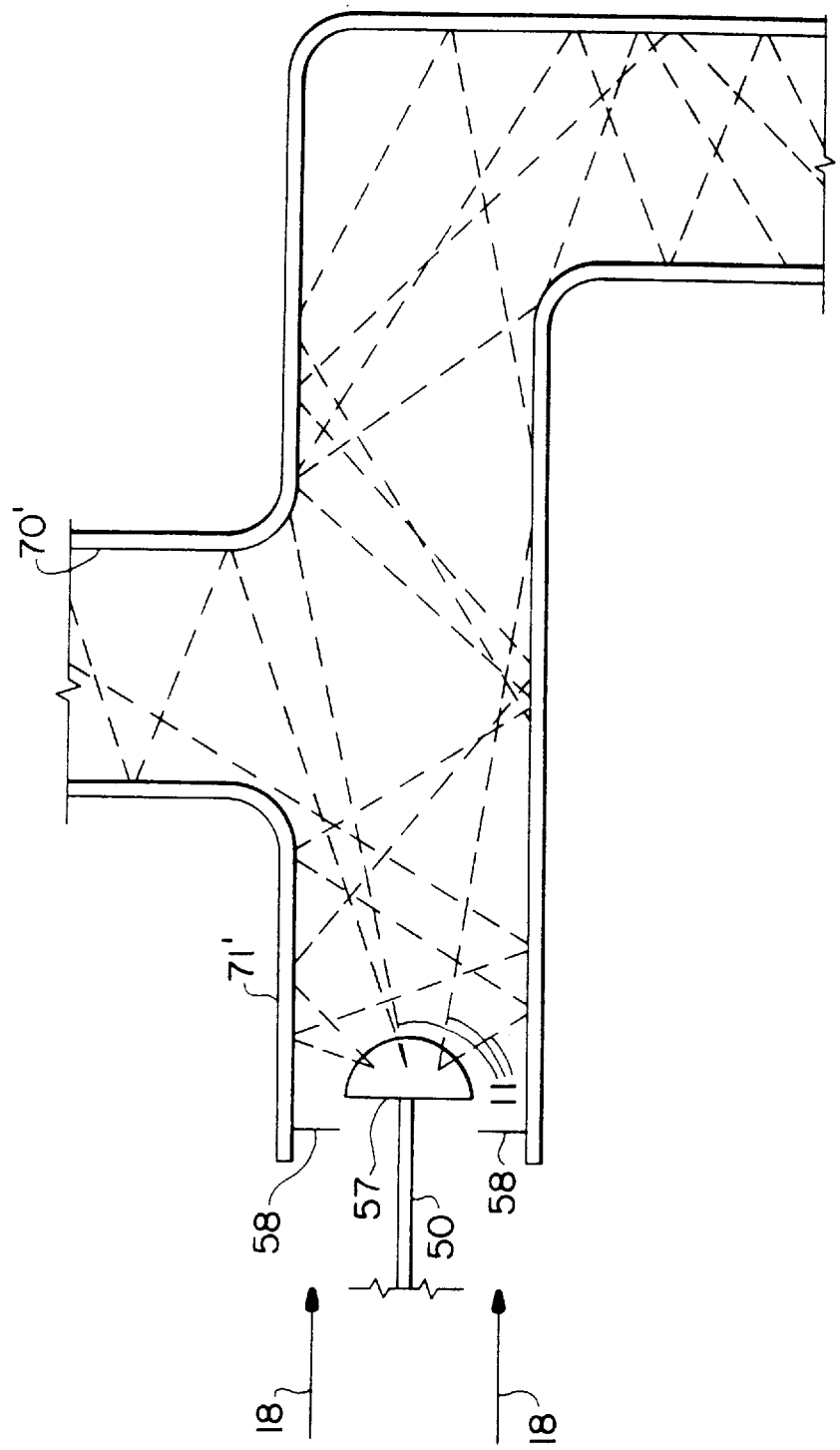

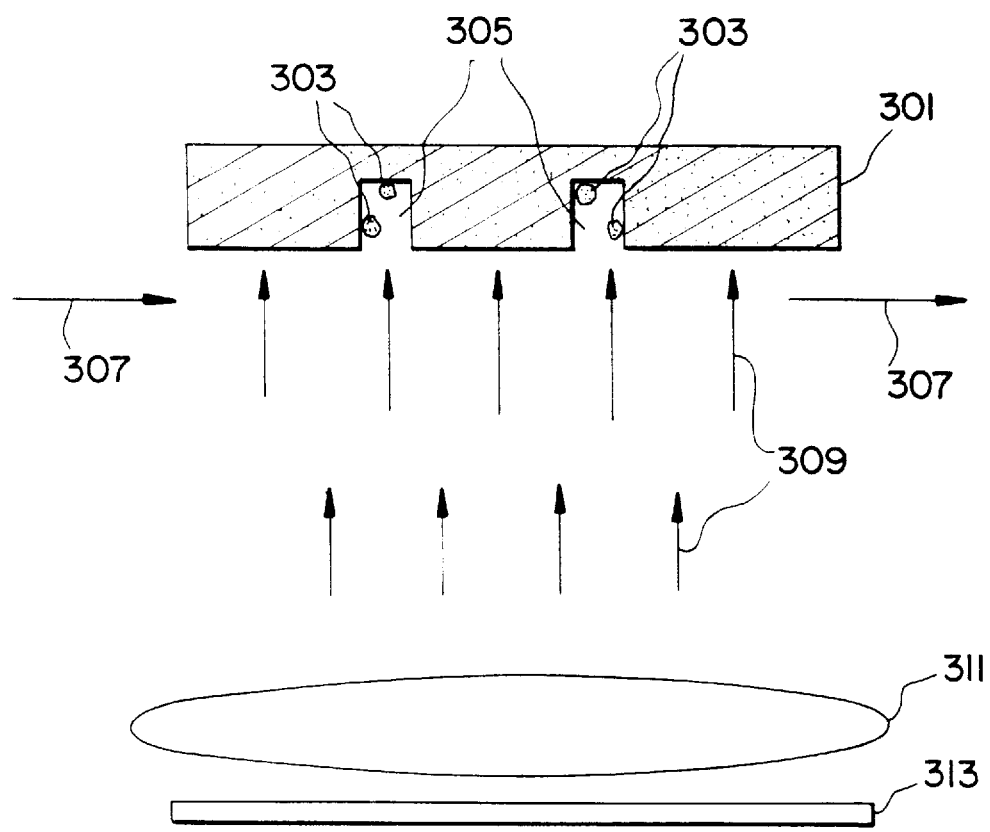

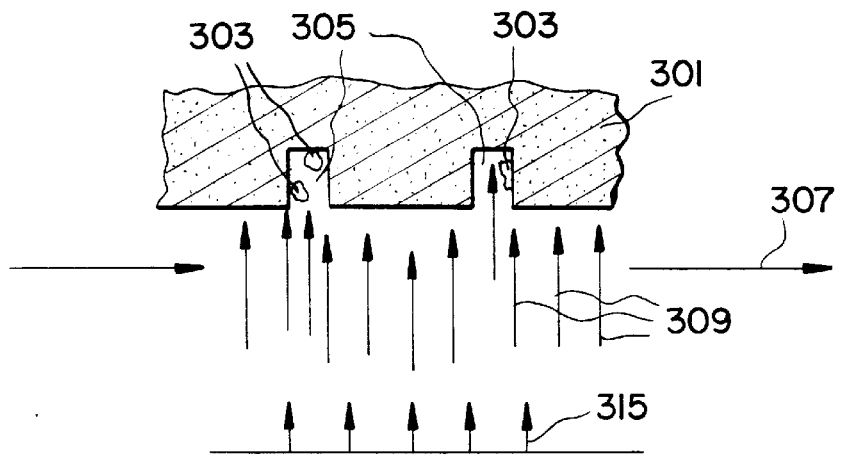
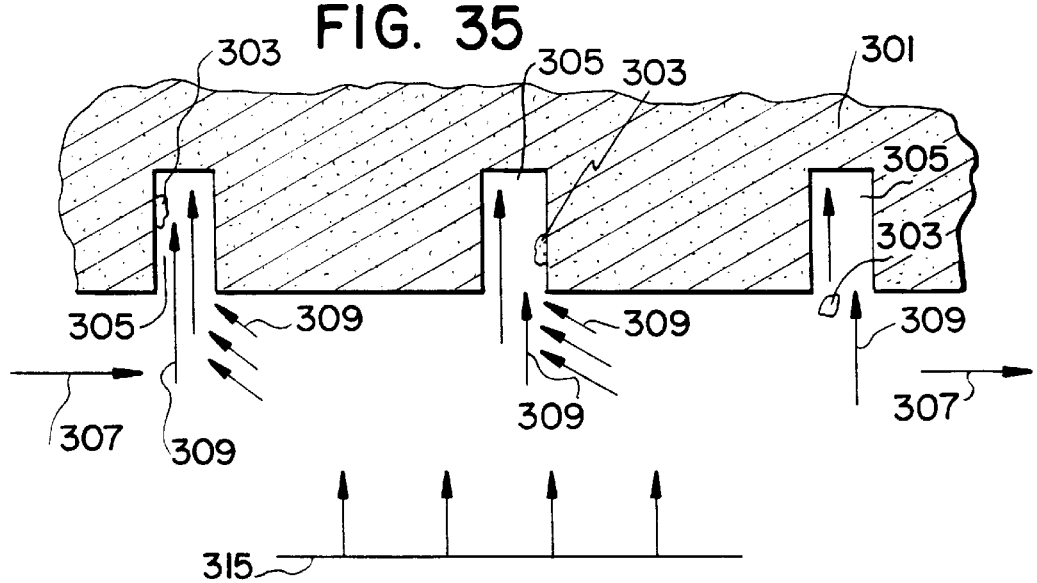
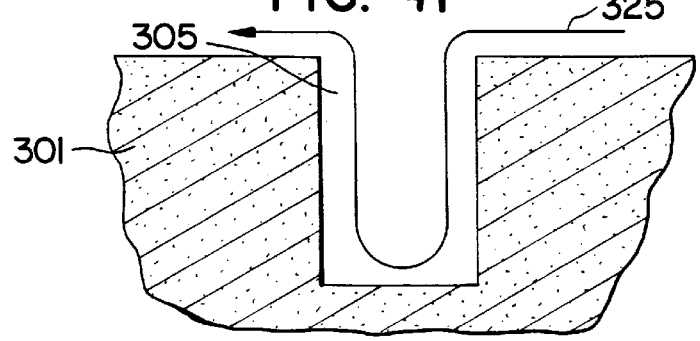

REMOVAL OF SURFACE CONTAMINANTS BY IRRADIATION USING VARIOUS METHODS TO ACHIEVE DESIRED INERT GAS FLOW OVER TREATED SURFACE

This application is a continuation of application Ser. No. 08/045,165, filed on Apr. 12, 1993 now abandoned, which is a Continuation-in-Part of U.S. patent application Ser. No. 07/865,039 filed Mar. 31, 1992 now abandoned, which is a Continuation-in-Part of U.S. patent application Ser. No. 07/611,198, filed Nov. 9, 1990, now U.S. Pat. No. 5,099,557, which is a Divisional of U.S. patent application Ser. No. 07/216,903, filed Jul. 8, 1988 now U.S. Pat. No. 5,024,968.

BACKGROUND OF THE INVENTION

This invention relates to removing contaminants from a surface. More particularly, the invention relates to the removal of contaminants from a substrate surface by irradiation that does not alter the molecular crystal structure of the treatment surfaces.

As used herein, the term "contaminants" includes particles, films, and unwanted chemical elements or compounds. Contaminant particles may be discrete pieces of matter ranging in size from submicrons to granules visible to the unaided eye. Contaminant films may be organic or inorganic, and include such contaminants as human body oil from fingerprints. Contaminant chemicals include any element or compound which, at the time at which the cleaning process is performed, is undesirable. For example, hydroxyl groups (—OH) may be a desired reaction promoter on the surface of a substrate at one stage of a process and may be an undesired contaminant at another stage.

Contaminants may become adhered to a surface by weak covalent bonds, electrostatic forces, van der Waals forces, hydrogen bonding, Coulombic forces, ionic bonds or dipole-dipole interactions, making removal of the contaminants difficult.

In certain instances, the presence of surface contaminants renders the contaminated substrate less efficient or inoperable for the substrate's designated purpose. For example, in certain precise scientific measurement devices, accuracy is lost when optical lenses or mirrors in the devices become coated with microfine surface contaminants. Similarly in semiconductors, surface defects due to minor molecular contaminants often render semiconductor masks or chips worthless. Reducing the number of molecular surface defects in a quartz semiconductor mask by even a small amount can radically improve semiconductor chip production yields. Similarly, removing molecular surface contaminants, such as carbon or oxygen, from the surface of silicon wafers before circuit layers are deposited on the wafer or between deposition of layers significantly improves the quality of the computer chip produced.

Moreover, a significant portion of the debris that ultimately contaminates silicon wafers during production emanates from production apparatus such as process chambers in which the wafers are placed and pipes that conduct processing gas to the chambers. Accordingly, the level of wafer contamination experienced during the course of production can be significantly reduced by the periodic cleaning of such apparatus.

The need for clean surfaces free of even the finest contaminants has led to the development of a variety of surface cleaning methods. As described below, these known methods, however, each have serious drawbacks. The following processes involve the introduction of outside agents to the substrate surface.

Wet chemical cleaning technology—RCA Process

The RCA cleaning process is currently employed in semiconductor manufacture, flat panel display manufacture, and disk media manufacture. The RCA process has two variants—SC-1 and SC-2 (where SC=Standard Clean). In general, the SC-1 process is used to remove trace organics and particles. It consists of successive baths of aqueous ammonium hydroxide ($NH_4OH$), hydrogen peroxide ($H_2O_2$) and water ($H_2O$). The SC-2 process is used to remove surface trace metals and to form a passivating thin oxide to make the silicon or analogous surface hydrophilic. It consists of a series of baths in aqueous hydrochloric acid (HCl), hydrogen peroxide, and water. In manufacturing practice, the liquid baths are constantly but slowly refreshed, so that successive lots of wafers, for example, are exposed to particles from earlier lots. These contaminants are redeposited on surface.

There has been considerable research to extend the capability of the RCA process to remove particles as small as 0.2 $\mu$m. These liquids are near their physical limits in removing particle sizes below 0.3 $\mu$m, because even fresh chemicals can have as many as 10,000 particles/l of 0.5 $\mu$m or less, which corresponds to a probability of 10 particles per 125 mm/wafer. (See C. M. Osburn, R. P. Donovan, H. Berger, and G. W. Jones, J. Environ. Sci., March/April 1988, p.45.)

Industry experts also have pointed out that the wet chemical baths can cause oxide formation on the silicon, micro-roughening of the surface, and contamination from organic compounds and metallic elements (e.g., iron, copper, aluminum, and magnesium) that become dissolved in the baths. (See M. Itano, M. Miyashita, and T. Ohmi, *Proceedings*, Microcontamination 91, 1991, p.521; and T. Shinono, M. Tsuji, M. Morita, and Y. Muramatu, Ibid, p.544.)

Dilute Hydrofluoric Acid

Dilute hydrofluoric acid (HF) has recently been introduced in the semiconductor industry for the removal of organic contaminants, trace metals contaminants, and thin native oxide. However, HF causes micro-etching of the substrate surface, which is becoming a difficult but critical effect to control. Residual fluorine molecules can also cause the breakdown of the oxide in gate stacks and adversely affect other electrical parameters of a chip. Ohmi and others have recently reported that to control the micro-roughening effects of HF, it is necessary to control strictly the pH of the liquid, keep ultrapure water under temperature control, and use ultrapure chemicals to prevent the deposition of unwanted metallics such as Fe and Cu. (See M. Itano, M. Miyashita, and T. Ohmi, *Proceedings*, Microcontanination 91, 1991, p.521; and T. Shinono, M. Tsuji, M. Morita, and Y. Muramatu, Ibid, p.544.)

Megasonic and Ultrasonic Cleaning

Megasonic cleaning technology was developed by RCA in 1979 to complement the RCA wet chemical process to remove organic films and particles. In the Megasonic process, wafers, for example, are immersed in water, alcohols, or dilute SC-1 solutions and exposed to sonic waves (produced by piezoelectric transducers) in the range of 850–900 KHz. Particles from several microns down to 0.3 $\mu$m can be efficiently removed with input power densities of 2–5 W/cm$^2$. (See W. Kern, J. Electrochem. Soc. 137 (6) 1990, p. 1887). It has confirmed that the Megasonic process can remove particles down to 0.3 $\mu$m and has been demonstrated that at 0.5 $\mu$m line width geometries, metal lines can be easily lifted at the power levels needed to achieve acceptable cleaning efficiency. (See A. A. Busnania and I. I.

Kaskkoush, *Proceedings*, Microcontamination 92, 1992, p.563). Thus, for smaller geometries, Megasonics destroys the device.

Ultrasonics cleaning works on the same principal as the Megasonic process but uses liquid cavitation frequencies in the range of 20–80 KHz and power densities 50 times greater than Megasonics. The ultrasonic method is less effective in the removal of particles under 1 $\mu$m. (W. Kern, J. Electrochem. Soc. 137 (6) 1990, p. 1887.)

Both ultrasonic and Megasonic cleaning operate on the principal of introducing a cavitating liquid medium beneath the particle so that the hydrostatic forces will free the particle from the surface. The van der Waals and secondary adhesion forces for a 0.1 $\mu$m particle are estimated to be $10^8$ dynes. The forces exerted by the Megasonic cleaning are on the order of $10^3$ dynes, which explains its inability to remove particles of less than 0.3 $\mu$m. (See M. Ranada, Aerosol. Sci. and Technol. 7 1987, p.161).

Ultraviolet and Ozone Cleaning

The ultraviolet/ozone (UV/$O_3$) cleaning process uses a Hg or a Hg/Xe lamp capable of delivery energy in the 185–254 nm region. This method has proved to be relatively effective in removing residual organic films such as photoresist, but is not effective with salt, dust, fingerprints, and polymers degraded by ozone. There are concerns that residual peroxide molecules and volatile hydroxyl groups on the surface can change the surface from hydrophobic to hydrophilic which can cause downstream adhesion processing problems and can also attract unwanted contaminants from a downstream cleaning process. Depending on the surface, ozone may cause unwanted oxide formation, which will require another cleaning process to remove. Finally, to be truly effective, UV/$O_3$ requires a pre-clean process to remove inorganics. (See J. R. Vig, J. Vac. Sci. Technol. A. 3 (3), 1985, p. 1027).

Brush Cleaning

Brush cleaning with deionized water or alkaline solutions has been found to be an effective method for removing particles as small as 1.0 $\mu$m from the surface. Brush cleaning has found specific niches in the semiconductor industry such as a final clean for removing the slurry after chemical mechanical polishing. Careful control of the brush material and the placement of the brush on the surface is required to prevent surface damage and shedding of the brush material. (See W. Kern J. Electrochem. Soc. 137 (6) 1990, p.1887)

Vapor Hydrofluoric Acid

The emergence of cluster tool systems has led to the investigation of vapor phase HF as a cleaning agent, because wet chemical and mechanical systems are virtually impossible to integrate into cluster tools. Contamination from the process and the tool requires the wafer to be cleaned before and after each critical process step. Because all current cleaning techniques are either wet chemical or mechanical, the wafer must be taken out of the cluster environment for cleaning, thus obviating many of the advantages of the cluster system.

Research has been done to integrate vapor HF cleaning into a module that can be part of a cluster tool. In October, 1992, Genus, Inc. announced a module (originally developed by Advantage Production Technology, Inc.) that can be incorporated into a cluster system. A report by SEMATECH indicated that the HF vapor etch was not controllable and caused severe micro-roughening. (See B. Van Eck, S. Bhat, and V. Menon, *Proceedings*, Microcontamination 92, 1992, p. 694).

The control of HF has become a critical issue. Genus has investigated the use of the following vapor reagent combinations: UV/$O_2$; UV/$Cl_2$/$H^+$; and UV/$CL_2$/$H_2$. Results from experiments demonstrated that the etch rates using these particular vapor phase reagents are not controllable as the system is currently configured. Gate oxide degradation was also shown from these experiments, which investigated vapor HF's utility for increasing limited yield from a CMOS gate stack. (See J. deLarios, W. Krusell, D. McKean, G. Smolinsky, S. Bhat, B. Doris, and M. Gordon, *Proceedings*, Microcontamination 92, 1992, p.706) There are concerns regarding residual fluoride, chlorine, and hydride ions on the surface and how these ions could degrade parametric performance or cause downstream process problems.

Supercritical fluid cleaning

Supercritical fluid technology consists of using particles of frozen gas (such as argon) in an aerosol. (See W. T. McDermott, R. C. Ockovic, J. J. Wu, and R. J. Miller, Microcontamination, October, 1991, p.33, K. S. Schumacher, Proceedings, SEMI Ultraclean Manufacturing Conference, 1993, p.53., and E. Bok, Solid State Technology, June, 1992, p.117). The basis of this technology is momentum transfer from a high velocity gas stream with argon pellets directed at the surface particles. When the gas is cooled to a temperature of 84 K (−184° C.) at 0.68 atm, argon solidifies and forms an aerosol. The impact of the argon particles on the surface transfer energy to the surface particle, which is removed in the stream of cooled gas. Concerns with the use of this technique include thermal shock to the wafer, sub-surface ion migration, surface structural damage, and electrical parametric damage. To date, no study has been published on fully processed wafers to investigate whether supercritical media cause any electrical parametric damage.

Laser-assisted liquid cleaning

Another known process is cleaning with liquids superheated by a laser. There are two variations on this technique: the Allen process and the Tam process.

Allen Process—The Allen process (see U.S. Pat. No. 4,987,286 and S. Allen, Appl. Phys. Lett. 58 (3) 1991, p.203) is a wet cleaning technique using water and a $CO_2$ laser at the 1064 nm wavelength as a heat source. The water must penetrate into the interstice between the particle and the substrate surface and when it is rapidly heated by a pulse from the laser, it "explosively vaporizes" to propel the particle from the substrate.

Several potential problems have been noted with the Allen process. On a patterned wafer, water can penetrate under metal lines and lift them off when it vaporizes, not only damaging the circuitry but also generating particles on the surface. Using a narrowly focused $CO_2$ laser at an energy flux of 30 J/cm$^2$, as Allen described, can cause ablation effects on a patterned surface because most organic, polymeric, and metallic films ablate quite readily at 20 J/cm$^2$. To provide a directional bias to carry the particle away and avoid redeposition, Allen proposes to mount the substrate vertically or in an inverted position, relying on gravity. Alternatively, she proposes to direct a stream of gas from a gas supply conduit across the surface to carry away the particle.

Tam Process—The Tam process (see W. Zapka, W. Zemlich, and A. C. Tam, Appl. Phys. Lett. 58 (20) 1991 p.2217 and A. C. Tam et. al. J. Appl. Phys. 71 (7) 1992 p. 3515) is very similar to the Allen process. Tam's process uses alcohols such as ethanol and isopropanol as well as water. His process differs from Allen's in that he uses a burst of heated nitrogen gas through the chamber to spread the liquid medium; this is followed immediately by an Ir:YAG laser pulse. The sequence is repeated for several cycles. Using alcohols, energy densities of 5 J/cm² were required to remove particles but surface damage was observed. Tam has used a ethanol and a pulsed KrF excimer laser with energy fluxes greater than 350 mJ/cm² to remove 0.35 μm Al₂O₃ spheres, but he was unsuccessful in ambient conditions with no liquid media.

Other Processes

Pressurized fluid jet cleaning facilitates removal of particulate, but risks damaging treatment surfaces due to the high pressure at which the cleaning fluid is maintained. Further, this technique may electrostatically damage the treatment surface due to the presence of ions in the cleaning fluid. Similarly, strippable polymer tape may also contaminate treatment surfaces by depositing a polymer residue thereon.

Other known methods for cleaning substrate surfaces avoid the use of outside agents. These processes include:

Surface Melt

This process requires that the treatment surface be melted to release contaminants which are then removed by ultra high vacuum. This method has the disadvantage that the surface being treated must be briefly melted. Such melting may be undesirable, as for example when a semiconductor surface is cleaned between deposition of circuit layers and it is desired that the integrity of the previously deposited layers not be disturbed. Further, such an operation would be difficult if not impossible to implement for cleaning expansive, irregular surfaces, such as those found in pipes and wafer processing chambers. Finally, the ultra high vacuum equipment used in this process is both expensive and time consuming to operate.

Annealing

Annealing treatment methods suffer similar drawbacks. When a surface is cleaned by annealing methods, the treatment surface of the substrate being cleaned is heated to a temperature that is generally below the melting point of the material being treated but high enough to enable rearrangement of the material's molecular crystal structure. The surface being treated is held at this elevated temperature for an extended period during which time the surface molecular crystal structure is rearranged and contaminants are removed by ultra high vacuum. Annealing cleaning methods cannot be used where it is desired to maintain the molecular crystal structure of the substrate surfaces.

Ablation

Another currently utilized cleaning method, known as ablation, suffers from its own particular drawbacks. With ablation, a surface or contaminants on a surface are heated to the point of vaporization. Depending on the material being ablated, the material may melt before being vaporized or the material may sublimate directly on heating. With ablation cleaning techniques, if damage to the treatment surface is to be prevented, the ablation energy must be applied accurately to the contaminants only, rather than the surface on which the contaminants lie, a difficult task when the contaminants are extremely small or randomly spaced, or when the surface being treated is irregularly shaped. Even where the ablation energy can be successfully applied only to the contaminant, it is difficult to vaporize the contaminant without also damaging the underlying treatment surface.

Surface cleaning by melting, annealing and ablation can be conducted with a laser energy source. However, using a laser energy source to remove contaminants from a surface by melting, annealing, or ablation does not overcome the inherent disadvantages of these processes. For example, in U.S. Pat. No. 4,292,093, "Method Using Laser Irradiation For the Production of Atomically Clean Crystalline Silicon and Germanium Surfaces" the laser annealing method disclosed requires both vacuum conditions and energy levels sufficient to cause rearrangement and melting of the treatment surface. Other known laser surface cleaning methods involving melting or annealing require similar high energy lasing and/or vacuum conditions, as disclosed in U.S. Pat. Nos. 4,181,538 and 4,680,616. Similarly the laser ablation technique disclosed in U.S. Pat. No. 3,464,534, "Laser Eraser" suffers the same drawbacks as other high energy ablation methods.

One source of the contaminants that end up being deposited on wafer surfaces is the equipment used in processing the wafer. The principal technique to reducing contamination from processing equipment is the performance of a periodic major cleaning process on the equipment which typically includes disassembly of the tooling and labor-intensive inspection of individual parts. However, cleaning methods conducted interim to the major cleaning process can reduce the frequency of such major cleaning.

One such interim cleaning method is that of purging with inert gas the chamber that houses the equipment in order to entrain and carry away any surface contaminants. Such a method is described in Chapter 24 (W. G. Fisher) in the publication *Particle Control in Semiconductor Manufacturing*, R. P. Donovan, ed., New York, Marcel Dekker, 1990, which teaches that it is desirable to maintain purge gas flow rates sufficiently high so that the gas flow through the equipment is in a turbulent flow regime, which is purported to enhance the entrainment of the contaminants into the inert gas. According to the publication, turbulent flow favors particle entrainment because a turbulent boundary layer is thinner than a laminar boundary layer and because turbulent flow has regions where the instantaneous fluid velocity is higher than the average velocity.

In applying such a method to the cleaning of wafers themselves, however, the use of turbulent flow may prove problematic because turbulent flow has localized velocity components that are normal to the wafer surface. Those velocity components may carry an entrained particle toward and into contact with the wafer surface where it can be retained. This is especially true with particles that may have just been liberated from the wafer surface. Such "just liberated" particles are relatively close to the wafer surface and hence are more susceptible to being re-deposited onto the surface due to the localized velocity components normal to the wafer surface.

SUMMARY OF THE INVENTION

The invention solves the problems and avoids the drawbacks of the prior art by removing surface contaminants from the surface of a substrate without altering the molecular crystal structure or otherwise damaging the surface being treated. Gas is flowed across the substrate treatment surface and the substrate is continuously irradiated at an energy density and duration great enough to release surface contaminants from the substrate treatment surface and small enough not to alter the molecular crystal structure of the substrate treatment surface. Optimally, the gas is inert to the substrate treatment surface. Moreover, to best avoid the possibility of contaminants entrained in the flow being deposited on the treatment surface, the flow of gas is in the laminar flow regime. The irradiation source may be any means known in the art such as a pulsed or continuous wave laser or high-energy lamp. Preferably the radiation is generated by a pulsed ultraviolet laser. The invention can be beneficially applied for removing surface contaminants from a generally planar semiconductor substrate before, between and after deposition of the circuitry layers on the semiconductor substrate. It may also be applied to irregularly shaped surfaces or, more specifically, surfaces lying in non-coincidently related planes. Such planes encompass all possible relationships between the surfaces of a substrate except those occupying the same space or plane. For example, surfaces that are parallel or angularly related, such as opposing interior walls of a pipe or adjacent walls in a cubical chamber, respectively, occupy non-coincidently related planes.

BRIEF DESCRIPTION OF THE DRAWINGS

FIGS. 6 through 11 are schematic end views of apparatuses for conveying gas and radiation to irregularly shaped treatment surfaces according to the principles of the invention.

FIGS. 17 and 17a are schematic side views showing application of the invention of FIG. 5 with a flexible, porous centering support structure.

FIG. 18 is a schematic side view showing application of the invention with an optic diffuser.

FIGS. 33–35 are schematic diagrams of contaminant removal methods and apparatus according to the invention.

FIG. 41 schematically illustrates a streamline of the inert gas flow through a cavity in a substrate when a secondary flow of inert gas is introduced.

DETAILED DESCRIPTION

Figure 1:
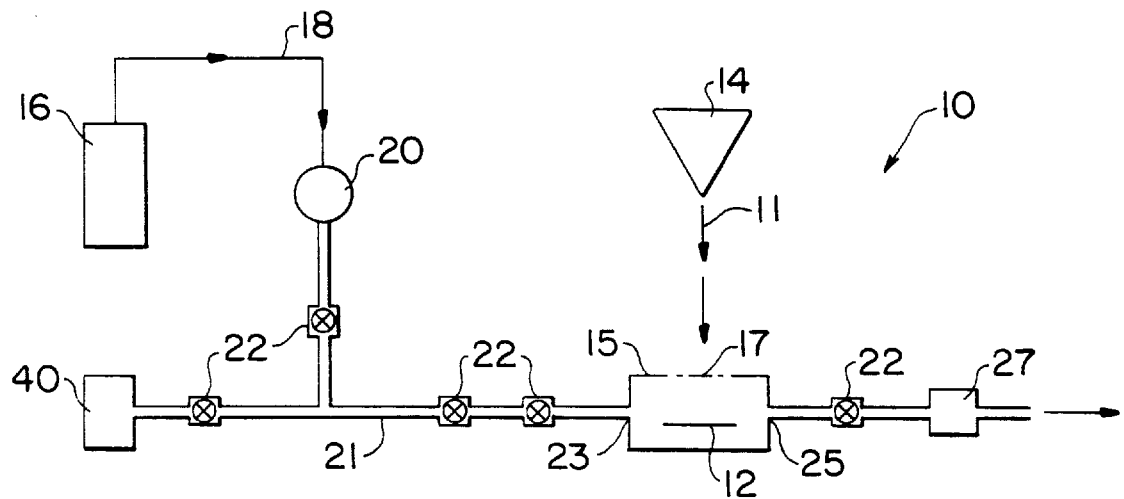
FIG. 1 is a schematic diagram of a contaminant removal method and apparatus according to the invention.

Reference will now be made in detail to presently preferred embodiments of the invention, examples of which are illustrated in the accompanying drawings. Throughout the drawings, like reference characters are used to designate like elements.

1. Basic Treatment Method and Apparatus

A method and apparatus for removing surface contaminants from the surface of a substrate without altering the molecular crystal structure or otherwise damaging the substrate surface is illustrated schematically in FIG. 1. As shown in FIG. 1, an assembly 10 holds a substrate 12 from which surface contaminants are to be removed. A gas 18 from gas source 16 is constantly flowed over substrate 12. Gas 18 is inert to substrate 12 and is flowed across substrate 12 so as to bathe substrate 12 in a non-reactive gas environment. Preferably, gas 18 is a chemically inert gas such as helium, nitrogen, or argon. An enclosure 15 for holding substrate 12 communicates with gas source 16 through a series of tubes 21, valves 22, and a gas flow meter 20.

According to the embodiment of the invention shown in FIG. 1, enclosure 15 comprises a stainless steel sample reaction cell fitted with opposing gas inlet and outlet ports 23, 25 respectively. Enclosure 15 is fitted with a sealed optical grade quartz window 17 through which radiation can pass. Inlet and outlet ports 23, 25 may comprise, for example, stainless steel tubing fitted with valves. After sample 12 is placed in enclosure 15, enclosure 15 is repeatedly flushed and backfilled with gas 18 and is kept at a pressure slightly above ambient atmospheric pressure to prevent inflow of other gases. Although enclosure 15 is shown as a solid chamber, it is anticipated that a surface being cleaned could be enclosed in any type of enclosure through which a gas can be flowed. For example, if the surface being treated is a large fixed object, a large portable enclosure such as a plastic bag might be utilized.

Flow of gas 18 may be regulated by a suitable flow meter 20 which may suitably be a Matheson Model 602 flow meter. Valves 22 are preferably metering, regulating or bellows valves suitable for high temperature and pressure applications and for use with toxic, hazardous, corrosive or expansive gases or liquids, as for example the Swagelok SS-4H™ series valves by Swagelok Co. of Solon, Ohio. Valves 22 can be opened or closed to isolate enclosure 15, to place enclosure 15 in communication with gas source 16 or to place enclosure 15 in communication with another substance, such as a gas for depositing on substrate 12, coming from an alternate source 40.

According to the method of the invention, high-energy radiation is irradiated upon the substrate treatment surface at an energy density and duration between that required to release surface contaminants from the substrate treatment surface and that which will alter the molecular crystal structure of the surface. According to the embodiment of the invention shown in FIG. 1, a radiation source 14 which may be a laser or high-energy lamp generates radiation 11 directed against the treatment surface of substrate 12. In FIG. 1, source 14 is shown as being outside enclosure 15 and irradiating sample 12 through quartz window 17. However, it is contemplated that source 14 could alternatively be placed within the enclosure 15.

The energy flux and the wavelength of the high-energy irradiation are preferably selected to be dependent upon the surface contaminants being removed. To this end, a gas analyzer 27 may be connected to outlet port 25. Analyzer 27 analyzes the contents of exhaust gas from enclosure 15 to facilitate selective energy and wavelength adjustment of source 14. Gas analyzer 27 may be a mass spectrometer as, for example, a quadrapole mass spectrometer manufactured by Bruker Instruments, Inc. of Billerica, Mass. or by Perkin Elmer of Eden Prairie, Minn.

Selection of the source of irradiation used in the invention depends upon the desired radiation energy and wavelength. The energy level of the radiation in electron volts/photon (Ev/photon) is preferably at least twice the energy necessary to break the bonds adhering the contaminants to the surface being cleaned. The bond energies between common contaminants (such as carbon and oxygen) and common substrate materials (such as silicon, titanium, germanium, iron, platinum and aluminum) range between 2 and 7 Ev/bond, as disclosed in Handbook of Chemistry and Physics, 68th ed., pp. F-169 to F-177 (CRC Press 1987). Accordingly, radiation sources emitting photons with energies in the range of 4 to 14 Ev/photons are desirable. The wavelength should be below the wavelength that would compromise the integrity of the substrate surface by the well-known photoelectric effect, as described in G. W. Castellan, *Physical Chemistry*, 2d ed., 458–459 (Academic Press, 1975) which is hereby incorporated by reference. The preferred wavelength depends on the molecular species being removed and the resonance states of such species.

Any means known in the art for generating radiation of a suitable energy level may be used in the invention, including high-energy lamps and lasers. Depending upon the application, it is anticipated that light energy from such sources may range from deep ultraviolet to infrared, with corresponding wavelengths from 193–3000 nm, respectively.

The wavelengths and photon energies of a number of suitable lasers are listed in Table 1, below.

TABLE I

Specifications for Suitable Lasers

| Laser | Wavelength (nm) | EV/photon |
| --- | --- | --- |
| XeCl, pulsed | 308 | 4.04 |
| argon-ion, continuous wave | 257 | 4.83 |
| KrF, pulsed | 248 | 5.01 |
| ArF, pulsed | 193 | 6.44 |
| Tunable dye lasers, pulsed or continuous wave | 200–800 | 6.22–1.55 |

These lasers are described in greater detail in the following references: M. J. Webber, ed., *CRC Handbook of Laser Science*, Vols. 1–5 (1982–1987); Mitsuo Maeda, *Laser Dyes* (Academic Press 1984); and laser product literature from Lambda Physik at 289 Great Road, Acton, Massachusetts, Coherent, Inc. at 3210 Porter Drive, Palo Alto, Calif., and Spectra-Physics at 1250 West Middlefield Road, Mountain View, Calif. It is anticipated that high-energy xenon or mercury lamps or other types of lasers, including visible, ultraviolet, infrared, x-ray or free electron lasers might be utilized as appropriate sources of radiation.

According to the invention, the irradiation directed against the substrate treatment surface from which contaminants are being removed has a power density less than that required to alter the molecular crystal structure of the surface. Preferably, the power density and duration of the irradiation are selected so as to impart an amount of energy on the substrate surface that is significantly below the energy required for alteration of the substrate surface structure. The preferred energy level is dependent on the composition of the substrate being treated. For example, with certain substrate materials such as plastics, this energy level would be much lower than for other materials such as high strength carbide steels. The heats of formation for various materials are well known and are reported in the *Handbook of Chemistry and Physics,* 68th ed., pp. D33–D42 (CRC Press 1987). The heat of formation generally corresponds to the amount of heat required to break down various materials and can be used as a guideline in selecting an irradiation energy density and duration that will not alter the molecular crystal structure of the treatment surface. The heats of formation of a number of common substrate materials are summarized in Table II, below.

TABLE II

Heats of Formation of Substrate Materials

| Material | Heat of Formation |
| --- | --- |
| $Al_2O_3$ | 16906.7 kJ/mol; 17.52 Ev/molecule |
| $SiO_2$ | 840.3 kJ/mol; 9.11 Ev/molecule |
| $Nb_2O_5$ | 1528.2 kJ/mol; 13.27 Ev/molecule |
| NiO | 230.6 kJ/mol; 2.50 Ev/molecule |
| $Ti_2O_3$ | 500.2 kJ/mol; 15.63 Ev/molecule |

The irradiation energy density and duration used in the present invention is such that the heat of formation is not approached on the substrate treatment surface. Finding the maximum energy usable on a given substrate material, however, will require some experimentation in light of the material's known heat of formation. Such experimentation ensures that annealing, ablation and melting will not occur.

The irradiation is preferably directed perpendicular to the plane of the portion of the substrate being treated, to maximize the energy flux at the surface for a given power output from the source of irradiation. However, the irradiation may be directed at an angle to the substrate as convenient or necessary for implementation of the process in a particular environment. Of course, the energy flux at the surface will vary with the sine of the incident angle, which must be taken into account in selecting the power output of the irradiation source and the dwell time.

When a substrate surface is irradiated as described above, the bonds and/or forces holding surface contaminants to the substrate surface are broken and the inert carrier gas carries contaminants away from the substrate surface during irradiation. As long as the cleaned substrate remains in the inert gas environment, new contaminants will not form on the substrate surface. If necessary, a suitable trapping system may be connected to enclosure outlet 25 for trapping and neutralizing removed contaminant species.

a. Theoretical Quantum Dynamic Basis for the Process

The removal of a contaminant from a surface by irradiation coupled with an inert gas flow can be described by nonlinear optical theory, a branch of quantum mechanics.

The basis of nonlinear optical theory is derived from Maxwell's equations in nonlinear media, which are:

$$\nabla \times E = \frac{(\delta B/\delta t)}{c} \quad (1)$$

$$\nabla \times B = \frac{(\delta E/\delta t)}{c} + \frac{4\pi}{c} J \quad (2)$$

$$\nabla \cdot E = 4\pi\rho \quad (3)$$

$$\nabla \cdot B = 0 \quad (4)$$

where E is the electric field, B is the magnetic field, J is the current density, and ρ is the charge density.

With the advent of the laser and other high energy irradiation sources, access to nonlinear processes that have been theoretically postulated since the 1880s have become accessible. The theory of nonlinear optics is described in N. Bloembergen, Nonlinear Optics, New York: Benjamin/Cummins Publishing Company, 1965 (fourth printing 1982) and Y. R. Shen, The Principles of Nonlinear Optics, New York: John Wiley and Sons, 1984.

A laser generates a beam that is coherent and has highly directional properties. This property of the beam is defined as the radiation force, which has unique properties that can be used to remove adhered contaminants from a surface. The radiation force in a uniform medium is given by Equation (5), which is also derivable from Maxwell's equations:

$$f = \nabla p + \frac{\rho(\delta\epsilon/\delta\rho)}{8\pi\nabla E^2} - (\epsilon - 1)(\delta G/\delta t) \quad (5)$$

where ρ is the density of the medium, p is pressure, and G is the electromagnetic density in a vacuum.

Experiments by Ashkin and Dziedic (A. Ashkin and J. M. Dziedic, Appl. Phys. Lett. 28 (1976) p. 333, 30 (1977), p. 202, and 19 (1971) pg. 729) have demonstrated that small particles such as 10 μm latex spheres can be removed from a surface in a laser field of sufficient photon flux. Once the laser beam is stopped, the latex sphere returned to the surface. This nonlinear process is referred to as optical levitation. The experiments by Ashkin demonstrated that the properties of the irradiation source can be used to overcome the local adhesion and gravity forces. This phenomenon has been observed in tests of the process described herein with particles smaller than 5 μm. Re-adhesion of the particle after the radiation field has passed over a location is prevented by the use of the flowing inert gas.

Another nonlinear process that has been observed in tests of the present process and apparatus is multiphoton dissociation ("MPD"). A high energy irradiation source with a sufficient photon flux interacting with a surface that has on it a contaminant can remove the contaminant by MPD. (See Y. R. Shen, Principles of Nonlinear Optics, New York: John Wiley and Sons, 1984, chapter 23, pp. 437–465.) Through this process, several photons can excite the vibrational and rotational states that are not allowed by classical means. These new states to which the contaminant has access can be described as quasi-metastable. The quasi-metastable state can lead to the dissociation of the contaminant from the surface or the breakup of the contaminant. The dissociation process is further enhanced by the nonlinear susceptibilities contributed by the surface and the contaminant. Furthermore, MPD process theory postulates that one can selectively remove bonds based on knowledge of the surface and the chemical species that is to be removed by tuning the photon flux to take advantage of the nonlinear mechanism.

The nonlinear processes described above appear to be complementary. Depending on the contaminant and the surface, one nonlinear process may be preferable to the other or they may work in tandem.

b. Examples of Basic Treatment

The application of the basic treatment method and apparatus described above with regard to planar treatment surfaces are illustrated in the following examples. In Example I, various energy densities of a pulsed KrF excimer laser are applied to a silicon oxide substrate with varying degrees of success. In Example II, the need for the invention in the area of optical components is examined.

i. EXAMPLE I

The native oxide of silicon is necessary for the promotion of thin film growth on semiconductor surfaces. Unfortunately, when semiconductor surfaces of silicon oxide are exposed to the environment, carbon contaminants adhere weakly to the semiconductor surface. The presence of these contaminants greatly reduces the conductivity or the insulating nature of the thin film to be deposited. Therefore, in semiconductor production, great precautions are taken to minimize environmental exposure through the use of elaborate vacuum, chemical and mechanical techniques. Vacuum techniques are expensive especially if high or near ultra high vacuum is used to keep surfaces clean between processing steps. Chemical (wet and dry) and mechanical techniques can damage the substrate treatment surface and, if the substrate being treated is a processed integrated circuit, the underlying structure.

In an attempt to overcome these problems, radiation from a pulsed KrF excimer laser (a model EMG150 from Lambda Physik) whose fundamental wavelength is 248 nm (UV range) was applied to the surface of a silicon substrate in a sealed chamber through which argon gas was flowed. To decrease surface carbon contamination and decrease carbon percentage associated with chemisorbed organometallic (trimethyl aluminum), a precursor to aluminum thin film formation in semiconductor production, irradiation of 35 mJ/cm$^2$ for 6000 laser shots at a 10 Hz repetition rate was applied for 20 minutes to a silicon oxide substrate surface with the KrF excimer laser. The laser treated surfaces were exposed during a continuous flow of argon gas at a flow rate of 16 1/hr (4.5 ml/s) under a 1.03×10$^{-3}$ torr backing regulator pressure. After treatment, X-ray Photoelectron Spectroscopy ("XPS") analysis showed the substrate exhibited a significant decrease in surface carbon from a pretreatment average surface carbon covering 30–45% of the substrate surface to an after treatment average surface carbon covering 19% of the substrate surface. The substrate surface itself showed no damage or alteration.

A surface treated by a laser irradiation as described above and then exposed to an organometallic gas flow showed, by XPS analysis, that 20.8% of the substrate surface was covered with carbon as compared to 40–45% of the substrate surface that was covered with carbon after organometallic gas exposure on a non-laser treated surface. When the laser was applied, as described above, both prior to exposure to organometallic gas and again after gas exposure, only 8.9% of the surface was covered with carbon. Areas adjacent to the laser-exposed areas also exhibited some effects of the laser-cleaning treatment. Areas adjacent to the treated area showed a reduced carbon level of 12.7%. This effect probably is due to the Gaussian nature of the applied laser pulse.

Transfer of the wafer from the sample cell to the XPS analyzer was via an argon filled glove box. The silicon wafer was transferred to the XPS through an inert UHV transfer rod. This kept environmental exposure to a minimum.

Another wafer of silicon oxide, while exposed to argon gas as described above, was exposed to pulsed KrF excimer laser irradiation of 9 mJ/cm$^2$ for 6000 shots at a 10 Hz repetition rate. XPS analysis showed a surface carbon coverage of 40–45% both before and after laser treatment. Thus, irradiation at 9 mJ/cm$^2$ did not remove adsorbed surface carbon.

Another wafer or silicon oxide, while exposed to argon gas as described above, was exposed to pulsed KrF excimer laser irradiation of 300 mJ/cm$^2$ for 6000 shots at a 10 Hz repetition rate. At the end of treatment, the substrate surface had suffered significant damage, including a hole through the substrate. Thus, irradiation at 300 mJ/cm$^2$ altered the molecular crystal structure of the substrate surface.

These examples show laser irradiation at an appropriate energy flux and wavelength can decrease surface contamination without damaging underlying surface or adjacent structures.

It is expected, in view of the heat of formation of $SiO_2$, that subjecting a silicon oxide substrate surface to pulsed KrF excimer laser irradiation of less than 100 mJ/cm$^2$ for 6000 shots at a 10 Hz repetition rate would not alter the molecular crystal structure of the substrate. Pulsed KrF excimer laser irradiation of less than 75 mj/cm$^2$ for 6000 shots at a 10 Hz repetition rate is not expected to alter a silicon oxide substrate surface in any way.

ii. EXAMPLE II

High energy optical components are difficult to fabricate for such technologies as laser fusion, x-ray lithography and UV excimer laser optics. Laser fusion and x-ray lithography technologies are used exclusively in "clean" environments. Excimer laser optics have a short work life span because with current commercial film deposition technology, it is difficult to fabricate films capable of withstanding prolonged high-energy fluxes.

A perennial problem with high energy optics is optical breakdown. This phenomena can be described as "the catastrophic evolution of damage inflicted in a transparent medium in a strong laser field." Y. R. Shen, *Principles of Nonlinear Optics*, 1st ed., 528–540 (Wiley Interscience 1984). This phenomena occurs in solids as well as gases. With a solid, such as a high energy optic, optical breakdown is exacerbated by the presence of a surface defect such as scratches and pores in the bulk material. In most cases, optical breakdown is due to surface contamination such as adsorbed dust particles. The presence of these contaminants lowers the breakdown threshold which in turn limits the maximum laser power that can be used from a given laser system. This fact is a very important limitation regarding the pumping of a laser medium (solid state or gaseous) by an external pump energy source. This, in turn, limits the laser power that can be used to transmit energy through optical windows, lenses and other optical components.

Optical breakdown, for example on a solid, is promoted by the presence of surface adhered contaminants. The interaction of a laser pulse train with a sufficient energy cross section may deposit enough energy to generate an "avalanche" ionization on the solid surface. This can form a surface plasma which may disintegrate the solid. The presence of contaminants effectively decreases the laser's efficiency and decreases its use in potential applications.

To overcome the above described problems, the contaminant removal method, as described herein, can be used to remove adhered contaminants such as adsorbed dust. For example, to treat an optical component, the component is exposed to a continuous flow of argon gas during which time a pulse KrF excimer laser is directed at the surface of the optical component. The laser is tuned to an appropriate energy flux and wavelength that is considerably less than the high energy pulse required to promote ionization and subsequent plasma in high energy optics. The optical component surface is irradiated at the selected flux and wavelength for a duration sufficient to remove adsorbed contaminants.

iii. EXAMPLE III

Qualitative experiments were conducted with a Potomac Photonics SGX-1000 KrF laser (sold by Potomac Photonics of Lanham, Md.). The laser was operated at an average power of 60 mJ/s with a dwell time of 0.02 s and a 20 $\mu$m beam spot. Nitrogen was used at a flow rate of 140 ml/s, while the substrate was mounted on a translating stage with a stage velocity of 1 mm/s. Laser power was measured with a Molectron JD-1000 joulemeter with a J3-09 probe, sold by Molectron Detector, Inc. of Portland, Oreg. Visual inspection (at 1,000×magnification) of the results of the cleaning showed that organic oils (fingerprints) and aluminum flakes were removed from aluminum, silicon flakes and silicon haze were removed from silicon, and unidentified foreign material was removed from a 3.0 $\mu$m CMOS patterned wafer.

c. Selective Treatment of Substrate

Figure 2:
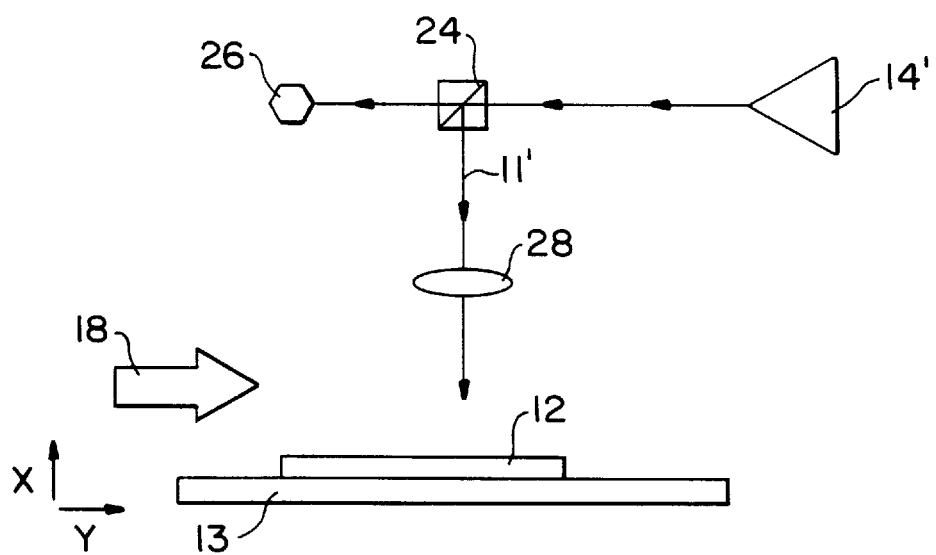
FIG. 2 is a schematic diagram showing how laser radiation is applied in one embodiment of the invention to remove contaminant from relatively planar treatment surfaces.
Figure 3:
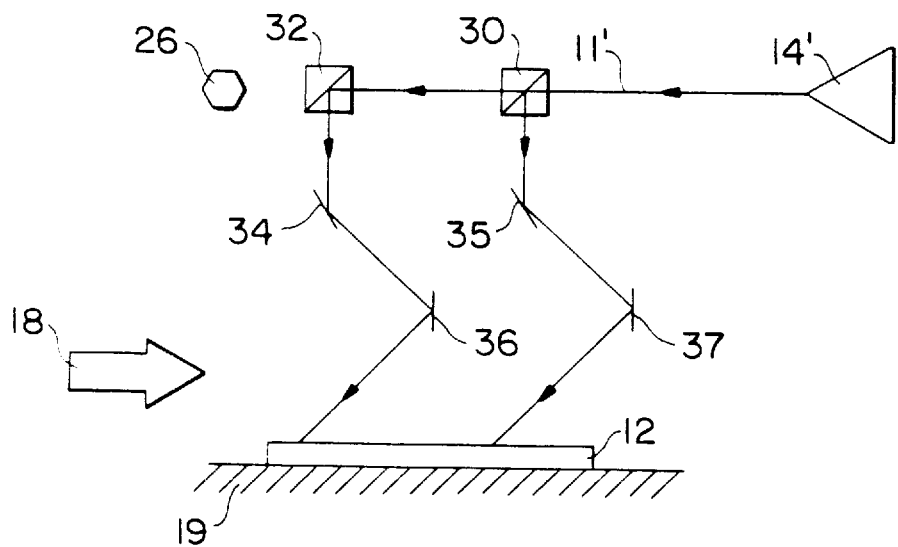
FIG. 3 is a schematic diagram showing how laser radiation is applied in another embodiment of the invention to remove contaminant from relatively planar treatment surfaces.

A planar substrate being treated in accordance with the invention may be selectively irradiated with a laser. As shown in FIG. 2, for example, substrate 12 is fixed on an XY table 13, which is selectively moved with respect to a fixed beam of laser pulses 11' that are generated by a laser 14', directed through a beam splitter 24 and a focusing lens 28 before contacting selected portions of the surface of substrate 12 over which inert gas 18 flows. Alternatively, as shown in FIG. 3, laser pulses 11' may be split by beam splitters 30, 32 into two sets of pulses which are selectively moved by adjusting mirrors 34–37 over the surface of substrate 12 on a fixed table 19. A laser power meter 26, measuring energy directly from the laser, allows for close monitoring of the laser power being applied to the substrate. Suitable laser power meters are available from Digirad of Oriskany, N.Y. and Scientech, Inc. of Boulder, Colo.

Figure 4:
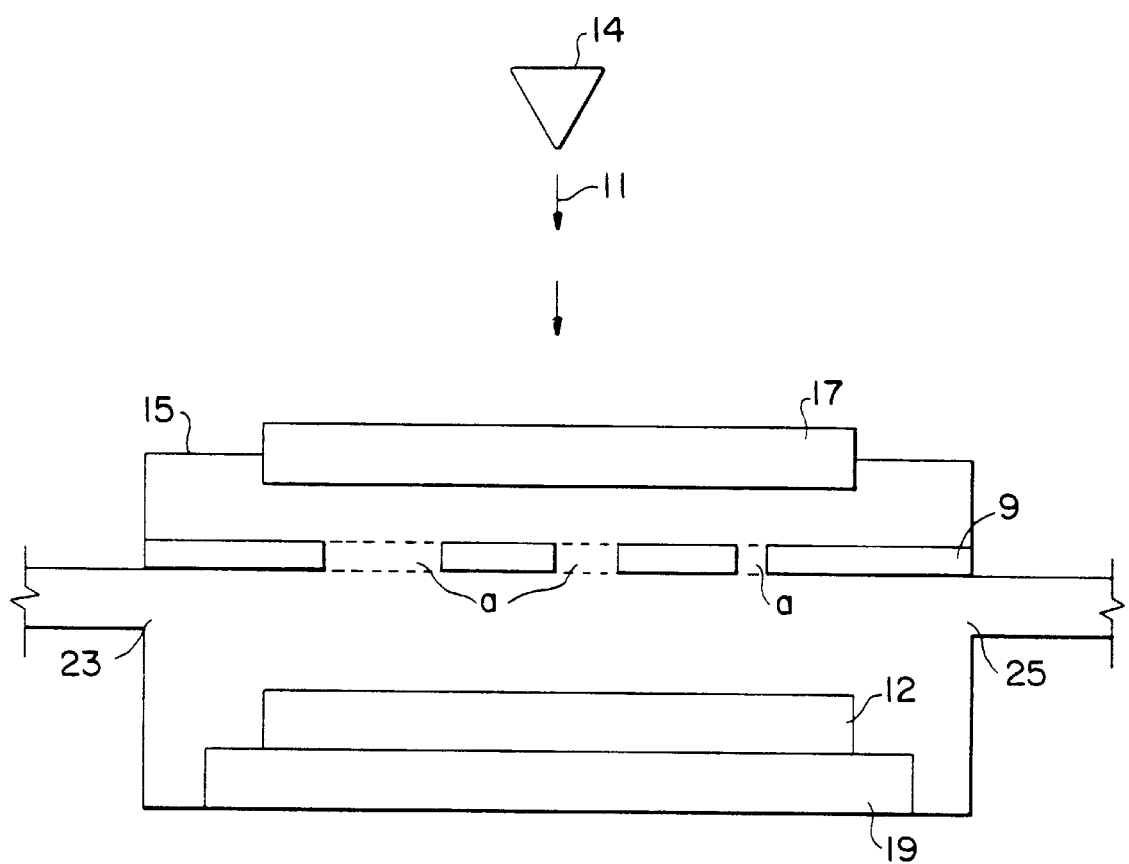
FIG. 4 is a schematic diagram showing the use of a mask in combination with radiation and gas applied in accordance with the invention to remove contaminant from relatively planar treatment surfaces.

Furthermore, selective irradiation of a planar surface may be achieved through the use of a mask, similar to that used in the semiconductor industry, placed between the source of radiation and the treated substrate. As shown in FIG. 4, mask 9 facilitates selective irradiation of substrate 12 secured to fixed table 19 by limiting access of radiation 11 to substrate 12 through mask passages a. As detailed in FIG. 1, enclosure 15 comprises a stainless steel sample reaction cell fitted with opposing gas inlet and outlet ports 23, 25, respectively, and sealed optical grade quartz window 17 through which radiation can pass.

It is anticipated that high-energy lamps may also be used to irradiate planar surfaces in configurations similar to that disclosed in FIGS. 2 through 4.

Figure 42:
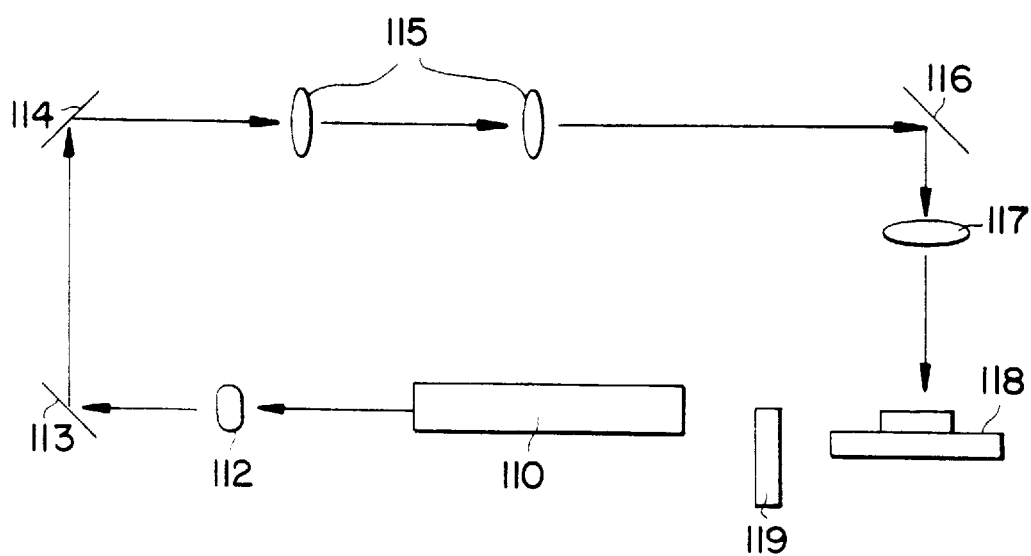
FIG. 42 schematically illustrates another embodiment of an apparatus incorporating the principles of the invention.

Another embodiment permitting selective irradiation of a planar surface is shown schematically in FIG. 42. The output from a suitable laser 10 is directed to a focus lens 112, is reflected from relay mirrors 113 and 114, and through a Galilean telescope 115. The irradiation from the laser is then reflected from another relay mirror 116, and focused through an adjustable final focusing lens 117 before it reaches the substrate, mounted on a holder 118 on an x-y translation stage. At least the holder 118 is disposed within a cell (not shown) through which inert gas flows. A flow meter 119 is disposed at the outlet of the cell. The arrangement illustrated schematically in FIG. 42 provides a particularly compact apparatus.

d. Laminar Flow Of Inert Gas

To reduce the likelihood that a contaminant which has been liberated from the substrate surface by irradiation and has been entrained by the gas flow will be redeposited downstream on the substrate surface, it is preferred to control the gas flow so that it does not impart to an entrained contaminant a velocity component normal to the substrate's surface. Such surface-normal velocity components are, by definition, inherent in turbulent gas flow and, in either turbulent or laminar flow, in areas of flow recirculation. In accordance with the principles of the invention, it is therefore preferred to maintain the gas flow across the substrate in a laminar flow regime and to avoid the creation of flow recirculation zones.

It is well known that for internal flows (as in pipes or, in the present case, a process chamber) laminar flow will be maintained for Reynolds numbers of less than approximately 2000. As shown in Equation (6), below, the Reynolds number (Re) is calculated as:

$$Re = \frac{\rho \bar{V} h}{\mu} \quad (6)$$

where $\rho$ and $\mu$ are the density and absolute viscosity, respectively, of the gas, h is the half-height of the distance between the walls bounding the flow, and V is the average velocity of the flow.

It is also well known that the drag force F on a free particle in a gas, such as a liberated particle entrained in the gas flow, is related to the gas viscosity, the diameter of the particle $d_p$, and the relative velocity V between the particle and the gas flow by the following relationship:

$$F = \frac{3\pi \mu d_p \bar{V}}{c} \quad (9)$$

where c is a slip correction factor. To maximize the force on a particle, and therefore to maximize the likelihood that the particle will be entrained into the gas flow and remain there, the flow velocity should be maximized. However, this is subject to the constraint that the Reynolds number should be maintained below approximately 2,000 to maintain laminar flow. It is also apparent that a higher gas velocity can be achieved for a given gas by reducing the half-height of the flow channel, h.

The average velocity V in the flow channel is related to the volumetric flow rate Q of gas through the channel as follows:

$$Q = VA \quad (11)$$

where A is the cross sectional area of the flow channel. Thus, the volumetric flow rate of the gas that must be supplied to the flow channel to maintain a given average velocity is less for a flow channel with a smaller cross-sectional area. The width of a flow channel is typically driven by the width of the substrate to be treated, but more flexibility is usually available to control the height of the channel. Therefore, to minimize the amount of gas required to achieve a desired velocity, it is preferable to minimize the height of the channel.

Figure 30:
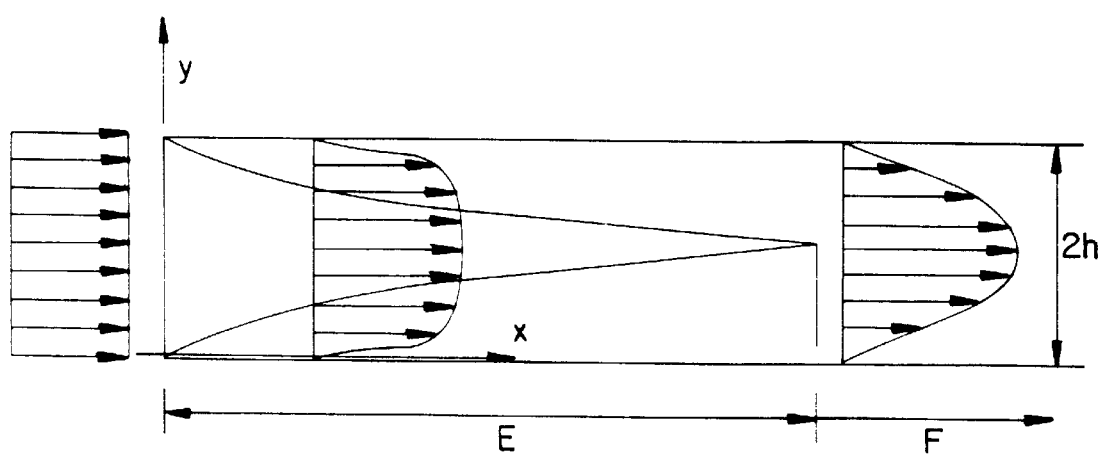
FIG. 30 is a diagram depicting a gas flow velocity profile at different stages of a flow channel.

The artisan will recognize that the gas flow velocity is not uniform across the width of the flow channel—the velocity is zero at the wall, and increases monotonically to a maximum value at the channel centerline. For fully developed laminar pipe flow, the velocity distribution is:

$$u(y) = 3\bar{V}\left(\frac{y}{h} - \frac{y^2}{2h^2}\right) \quad (12)$$

where y is the distance from the wall of the flow channel. As depicted in FIG. 30, the velocity profile is thus parabolic in nature. In the entry region E of the flow channel, i.e., in the region where the boundary layers that develop on each of the opposing walls of the flow channel have not met in the center of the channel, there is a boundary layer region near the wall and a potential core. Although there is not a closed-form solution for the velocity, as illustrated in FIG. 30 the flow velocity at a given distance near the wall is greater in the entry region E than in the region of fully developed flow F.

Other pertinent parameters in contaminant entrainment are the gas properties of density and absolute viscosity. These properties are combined in the kinematic viscosity P, which is the ratio of density and absolute viscosity:

$$v = \frac{\mu}{\rho} \quad (13)$$

As is evident from the Reynolds number equation (Equation (6), above), for a given Reynolds number and flow channel dimension, a higher velocity can be achieved with a higher kinematic viscosity, in a linear relationship. A competing consideration is the boundary layer thickness—in general, it is desirable to have the highest possible velocity as near to the wall as possible, which in turn means that it is preferable to have a thinner boundary layer. However, this is subject to the constraint that, while a turbulent boundary layer is generally thinner than a laminar boundary layer for similar conditions, turbulent flow is to be avoided.

Boundary layer thickness is proportional to the square root of the kinematic viscosity, and is inversely proportional to the square root of the average velocity in the flow channel. Thus, for a given velocity in the flow channel, the boundary layer will be thicker for a gas with a relatively high kinematic viscosity than for one with a relatively low kinematic viscosity. However, from the Reynolds number relationship, an increase in kinematic viscosity allows a proportional increase in velocity while maintaining the same Reynolds number (and thus maintaining laminar flow). Thus, the undesirable effects of increased kinematic viscosity on boundary layer thickness can be overcome by increasing the average flow velocity. Of course, these considerations are pertinent only in the entrance region—the boundary layer thickness is equal to the half width of the flow channel in the fully-developed region and is not affected by the gas properties.

The viscosity is a significant parameter in the drag force on a particle, as shown in Equation (9), above—the higher the gas viscosity, the greater the force on the particle. Thus gases with higher absolute viscosities are preferred.

As described above, any gas that is inert to the substrate may be used to carry out the treatment. The noble gases are particularly suitable, being inert to virtually all substrate materials. Nitrogen is also a suitable gas for most substrates. Of the noble gases, helium and argon are the most readily available and economically attractive to use. Of the three gases—helium, argon, and nitrogen—argon is preferred because it has the highest absolute viscosity.

Other parameters pertinent to the condition of the flow through the flow channel are the temperature and pressure of the gas. The viscosity (both absolute and kinematic) of most gases increases slightly with temperatures. However, in most commercial applications of the treatment process, the gas temperature will be approximately room temperature. In contrast, the gas pressure may be varied significantly. The gas density is proportional to its static pressure. Thus, referring again to the Reynolds number equation, shown in Equation (6), above, for a given Reynolds number, gas, and flow channel height D, an increase in density (through an increase in pressure) requires a decrease in average velocity. Thus, lower pressures will allow higher velocities to be achieved in a laminar flow regime.

Returning to the second aspect of avoiding imparting surface-normal velocity components to an entrained contaminant—avoiding recirculation zones—it is well known in the art that flow recirculation can be caused by adverse pressure gradients in the flow such as are produced by streamwise discontinuities or rapid changes in the profile of the surface over which the gas flows. It is therefore desired to avoid the formation of such discontinuities in the surface of the process chamber in which a substrate is to be treated, particularly at or closely upstream of the substrate. Further, the flow entering the flow channel should have a uniform velocity profile with a velocity vector parallel to the axis of the flow channel.

Figure 38:
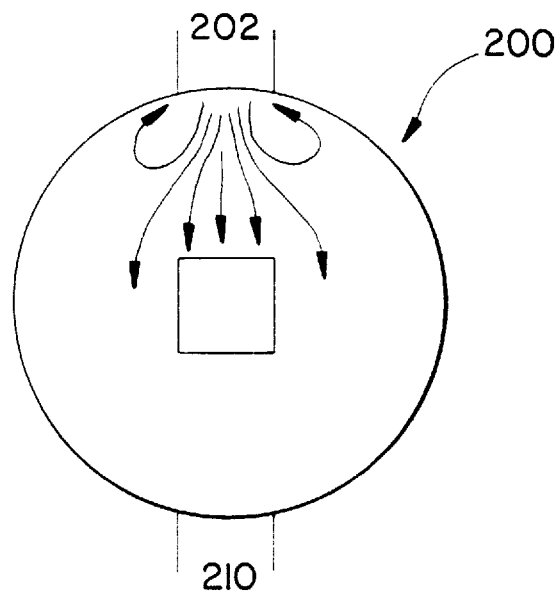
FIGS. 38 and 39 are schematic plan and cross-sectional elevation views of a test cell used with the method of the invention.
Figure 39:
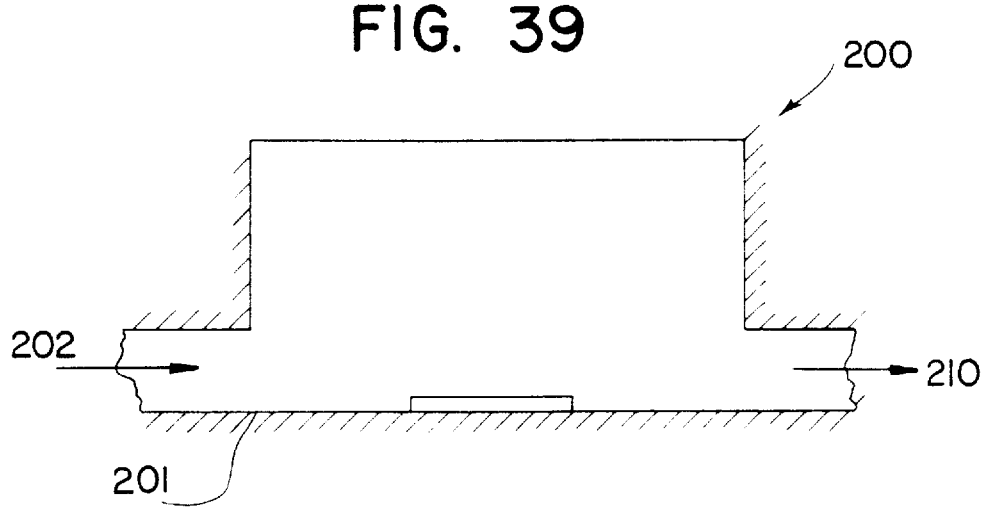

The significance of these flow considerations—avoiding recirculation and turbulent flow—are illustrated by the results of tests conducted in a reaction cell that had a less-than-optimum configuration for maintaining laminar, non-recirculating flow. This is the same cell configuration used for the tests described in Examples I and II above. The reaction cell 200 is shown schematically in plan view in FIG. 38 and in cross section in FIG. 39. The cell has an inlet 202 and an exhaust 210 that are even with the floor 201 of the cell and are each 0.25" (0.6 cm) in diameter. The substrate to be treated is also mounted on the floor 201. The cell is 7.6 cm in diameter and 2.5 cm in height.

Samples of bare silicon exposed to the room environment were cleaned in the cell using a low pressure 500 W Hg/Xe Model 6288 lamp, sold by Oriel Corporation of Stamford, Conn., with a 4" diameter lens coupled to an electronic time controller Model 84350 (also sold by Oriel), which had an output energy of 40 $\mu$J/s over the 200–315 nm region. The lamp delivered a total of 8 mJ/cm$^2$ over a 30 minute period. Energy measurements were made with a JL-1400A photometer with a JSEL/240/QnDS2/TD detector for the 200–315 nm range and a JXRL140B detector for the 300–400 nm range, all supplied by Jetlight Company, Inc. of Laguna Hills, Calif. Analysis of the sample (before and after treatment) was made with a VG Instruments Model 310 Auger/XPS spectrometer, now sold by Fisons Instruments of Danvers, Mass.

Figure 40:
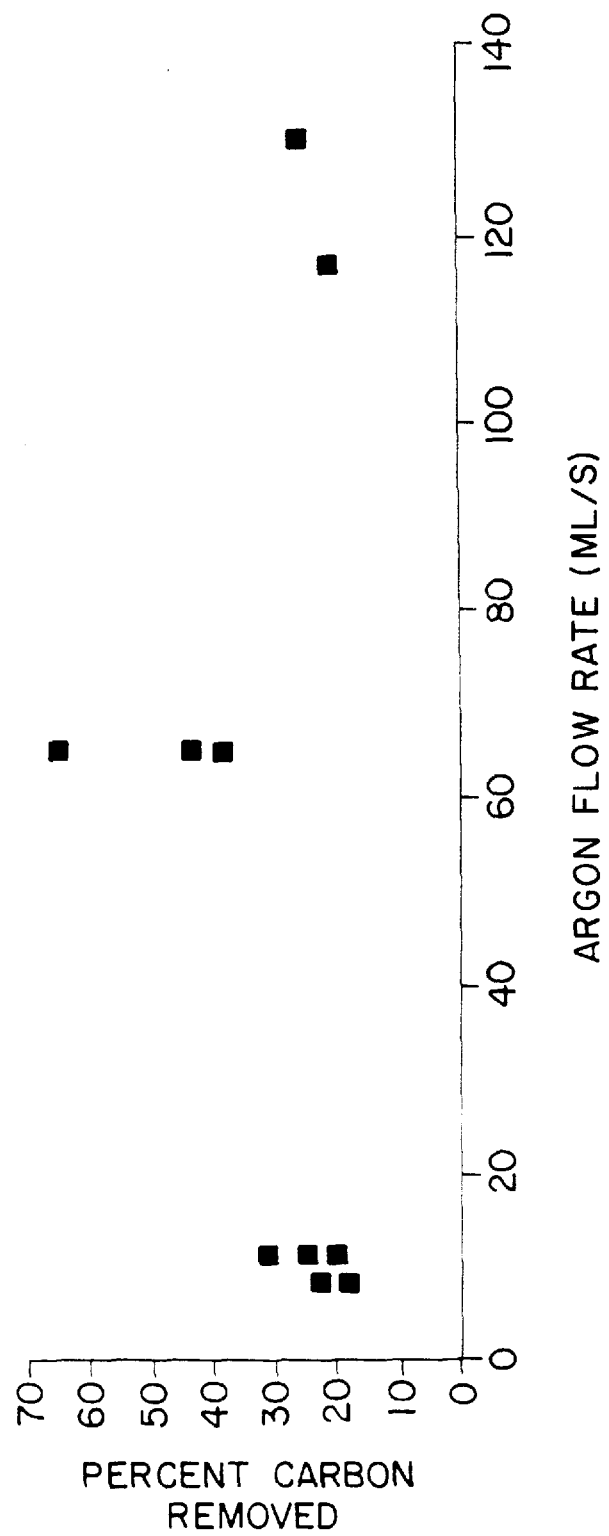
FIG. 40 shows data from a test of the method.

The gas flow rate through the cell was varied from 9 cc/s to 130 cc/s, controlled by a L-03217 series 150 mm variable flow meter sold by Cole-Parmer Instruments, Inc. of Niles, Ill., calibrated for argon, nitrogen, and helium. As can be seen in Table III below, and in FIG. 40.

TABLE III

| Test Data | |
|---|---|
| Argon Flow Rate (cc/s) | Carbon Removal (%) |
| 9 | 18.9 |
| 9 | 21.4 |
| 12 | 20.6 |
| 12 | 30.9 |
| 12 | 34.6 |
| 66 | 37.9 |
| 66 | 42.5 |
| 66 | 65.4 |
| 117 | 20.6 |
| 117 | 19.3 |
| 130 | 25.2 |

It is apparent from the data that the removal efficiency of the process depends on gas flow rate (and this on flow conditions in the cell). Although Reynolds numbers calculated based on the half-height of the cell were clearly in the laminar range, it is believed that at the higher flow rates, the unconstrained expansion of the gas into the cell from the inlet 202 created areas of recirculation on both sides of the inlet, and probably downstream eddies or vortices. This recirculation effect probably induced redeposition of contaminants.

Figure 27A:
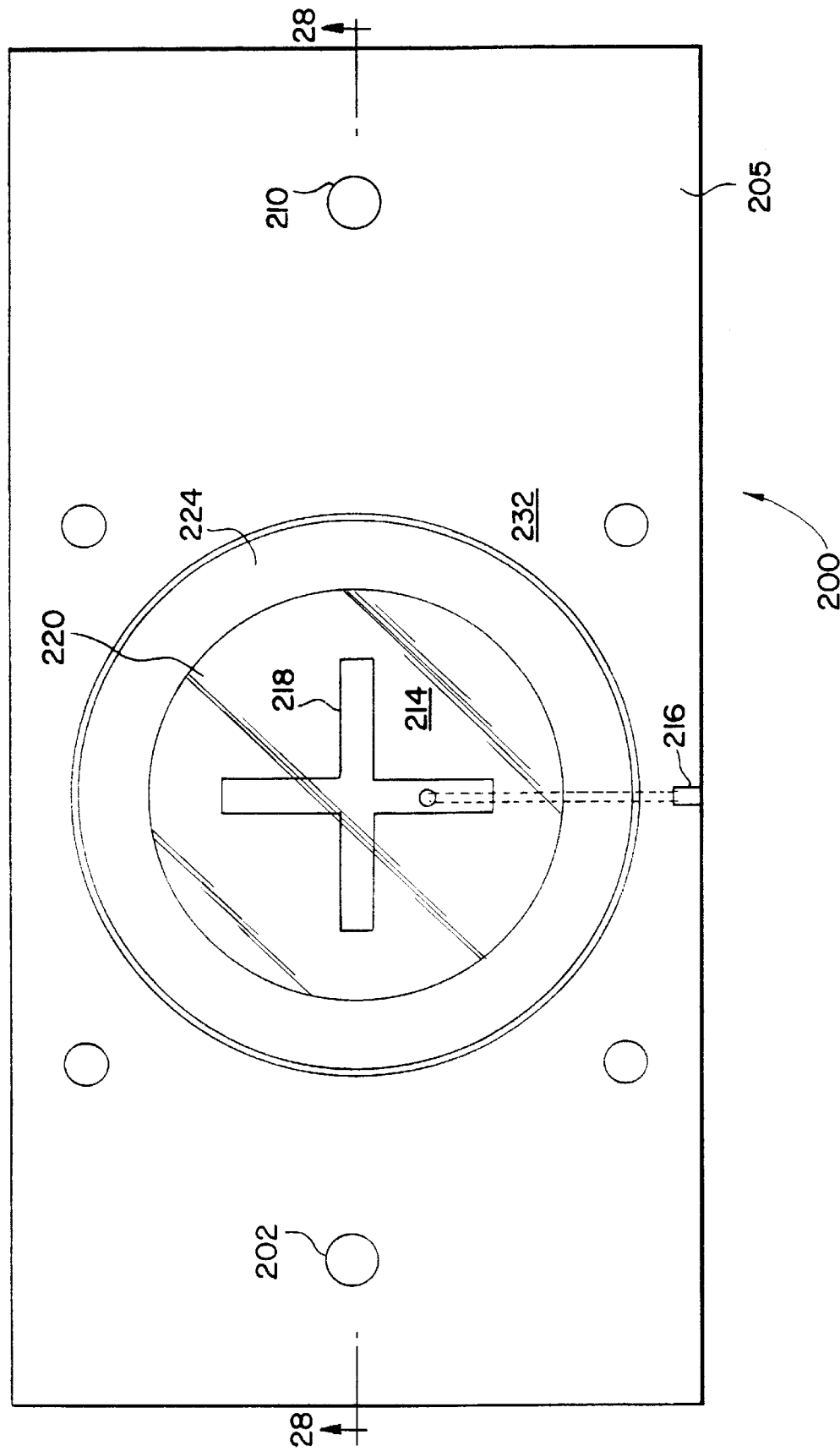
FIG. 27A is a top view of an apparatus for conveying gas and radiation to treatment surfaces according to the principles of the invention.
Figure 27B:
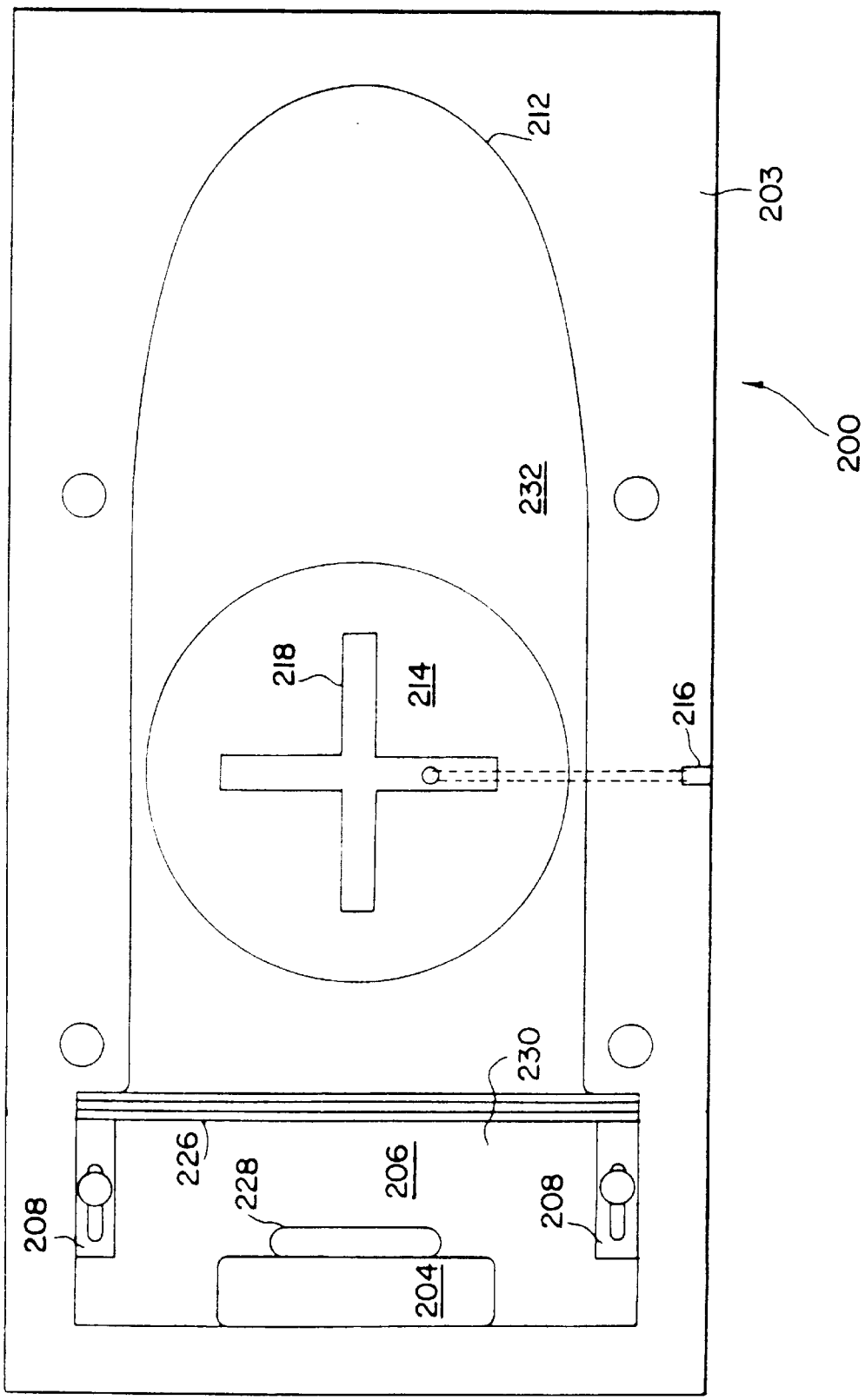
FIG. 27B is a top view of the apparatus of FIG. 27A with the top half of the cell removed.
Figure 28:
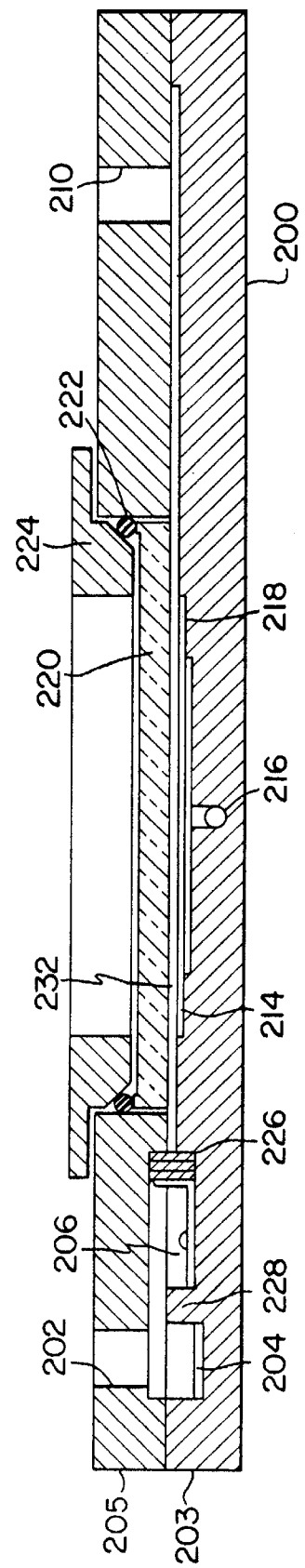
FIG. 28 is a cross-sectional view of the apparatus of FIG. 27 taken along the lines 28—28 of FIG. 27.
Figure 29:
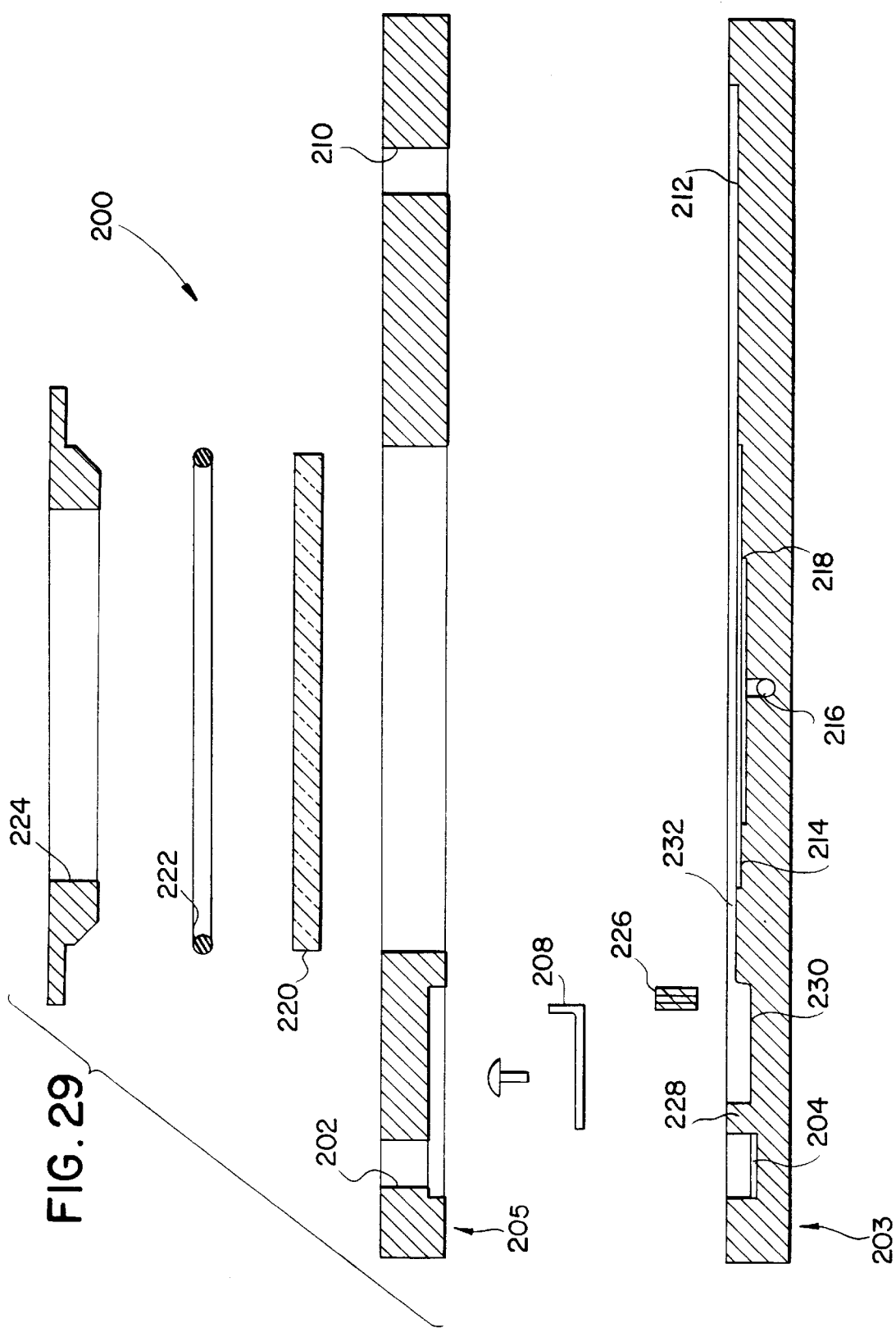
FIG. 29 is an exploded view of the apparatus of FIG. 27.

A reaction cell that embodies the principles set forth above—creating a non-circulating laminar flow over the substrate treatment surface—is depicted in FIGS. 27–29. This embodiment also provides a uniform flow at the entrance to the flow channel. Such a cell 200 is thereby designed to maximize the removal of contaminants from the treatment surface and to minimize redeposition.

The reaction cell 200 has an upper plate 205 and a lower plate 203, and includes an inlet 202 that is in fluid communication with a small mixing chamber 206, which, in turn, includes a low momentum plenum 230 and an adjacent trench 204. The plenum 230 is bounded at its ends by a filter assembly 226 and a vertical post 228.

The filter assembly 226 stands at the inlet to the flow channel 232 and is constrained in that position by two adjustable positioners 208. A seal (not shown), such as a teflon gasket, O-ring, or elastic band, is installed on the periphery of each member of the filter assembly to prevent bypass flow from the mixing chamber 206 into the flow channel 232.

The flow channel 232 extends downstream of the filter assembly 226 and includes a recess 214 for receiving a substrate sample (not shown). The recess is dimensioned such that the treatment surface of the sample is flush with the channel surface. To restrain the sample during treatment, a vacuum may be applied to the back of the sample through the vacuum suction port 216 and the vacuum channels 218.

A quartz disk 220 through which radiation can pass in the manner explained previously is disposed above the recess 214 for receiving the substrate sample. The quartz disk 220 is fixed and sealed in the cell 200 with a removable plate 224 and a suitably sized O-ring 222, respectively.

Downstream of the recess 214, is an exhaust duct 210 which is situated in a part of the flow channel 232 that is configured to have the shape of a "Rankine oval". As is well known to the artisan, a Rankine oval shape takes into consideration the inviscid flow solution for a uniform stream entering a sink point. In this context, the Rankine oval configuration serves to conduct the flow to the exhaust duct 210 while avoiding recirculation of the flow in the flow channel 232.

Figure 36:
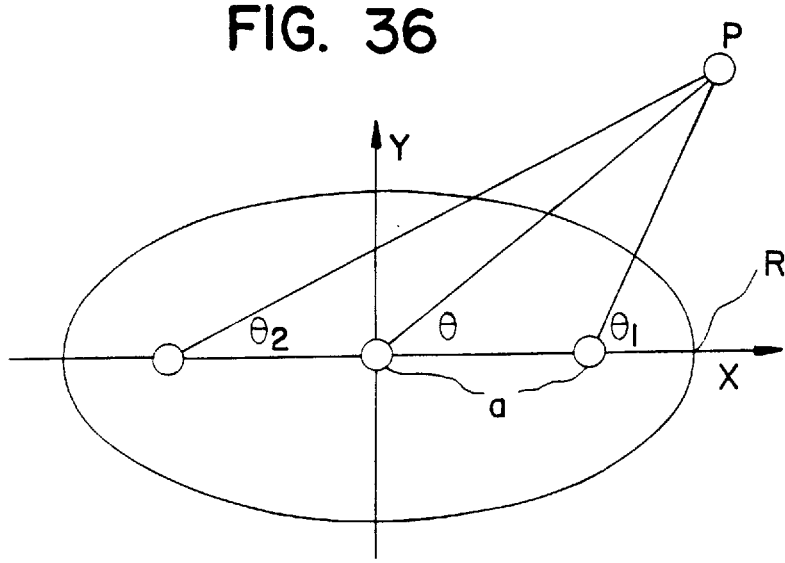
FIG. 36 illustrates the Rankine oval that describes the shape of part of a process chamber embodying the principles of the invention.

The shape of the "Rankine oval" is described in the following equation (in connection with the diagram in FIG. 36):

$$y = \frac{R^2 - a^2}{2a} (\theta_1 - \theta_2) \quad (14)$$

where R is the intercept of the Rankine oval with the positive side of the x axis.

The gas flow through the cell 200 originates at the inlet 202. The gas may be supplied to the inlet from a compressed gas reservoir fitted with a suitable pressure regulator (not shown) to control the gas pressure and flow rate. The gas supply is connected to the inlet by suitable piping. From the inlet 202, the gas is directed to impact the flat surface of the trench 204. Leaving the trench 204, the flow enters the plenum 230 and then travels to the filter assembly 226.

It is readily evident that the flow exiting the plenum 230 will be non-uniform—it will have varying velocities across the exit plane of the plenum and there will be velocity components that are not parallel to the flow channel axis. As described above, it is desired that both of those conditions be eliminated so that the flow entering the flow channel has a uniform velocity profile that is parallel to the axis of the flow channel 232 as depicted in FIG. 30. This is achieved with the filter assembly 226.

The filter assembly 226 is disposed at the inlet of the flow channel of the cell 200. When the flow is forced through the filter assembly 226, the flow conditions are changed so as to produce a uniform and parallel velocity profile across the width and height of the flow channel 232. To keep flow losses within acceptable limits, it is preferred to limit the pressure drop across the filter to 1–2 psi. Preferably, the filter assembly includes a porous sinterized metal filter such as those offered by Pall Ultrafine Filtration Company.

Figure 31:
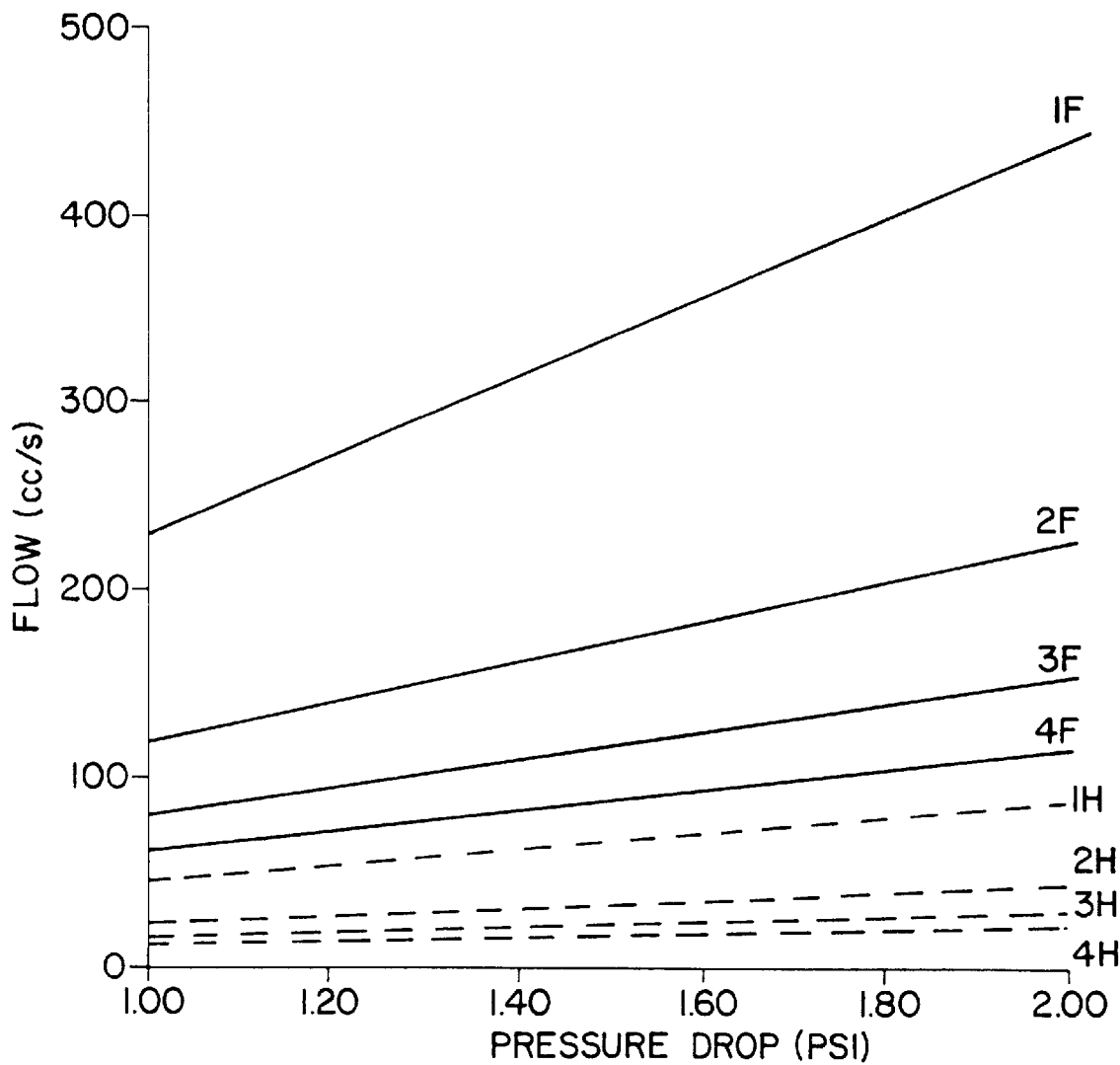
FIG. 31 is a graph providing flow and pressure data for use in selecting filters for the apparatus of FIG. 27.

The number and type of filters required are dictated by flow conditions. For example, for a flow of air ranging from 0–500 cc/s, FIG. 31 provides data allowing a choice of filters to provide the desired 1–2 psi maximum pressure drop. The solid lines, 1F–4F refer to a series of courser mesh Pall filters identified as PSS Grade F. The dotted lines 1H, 2H, 3H and 4H refer to a series of finer mesh Pall filters identified as PSS Grade H.

For an initial design condition of 70 cc/s, FIG. 31 indicates that the 1H filter would provide the desired 1–2 psi pressure drop. This indication from FIG. 30 has been experimentally verified.

The information provided by FIG. 31 is for air, which, since air is composed primarily of nitrogen, is pertinent to nitrogen as well. Adjustment to this data is necessary for other inert gases such as argon and helium.

For a cell 200 used for treating a substrate sample having a diameter of about 6 inches, the flow channel 232 has a width of approximately 6.5 in (16.51 cm) and a height of approximately 0.125 in (0.31 cm), thus resulting in a flow channel having a cross-sectional area of approximately 0.8125 in$^2$ (5.24 cm$^2$). The overall cell dimensions are 10 in by 20 in (25.4 cm by 50.8 cm). The cell is supplied with 0.25 in (0.6 cm) diameter tube fittings at both the inlet 202 and outlet 210, which are adequate for flow rates up to 500 cc/s. Larger fittings might be required depending on larger flow rates.

Using argon, the maximum velocity that can be achieved while maintaining laminar flow is determined by solving the Reynolds number equation for V. For argon, this is $$V = \frac{2000 \cdot (0.134 \text{ cm}^2/\text{s})}{0.16 \text{ cm}} \quad (16)$$

or 1,675 cm/s. The flow rate required to achieve this velocity is determined from Equation (11), $$Q = (1{,}675 \text{ cm/s})(5.24 \text{ cm}^2) \quad (17)$$

or 8,777 cm$^3$/s.

The gas flow within the process chamber can be modeled using well known fluid dynamics principles, including the Navier-Stokes equations, the continuity equations and the boundary-layer equations, a model of the gas flow within the cell can be formulated. Depending on the input of various parameters such as the type of gas and the volume flow rate, the Reynolds number can be calculated. One can also determine the velocity profile at a selected distances from the inlet of the flow channel.

Figure 37:
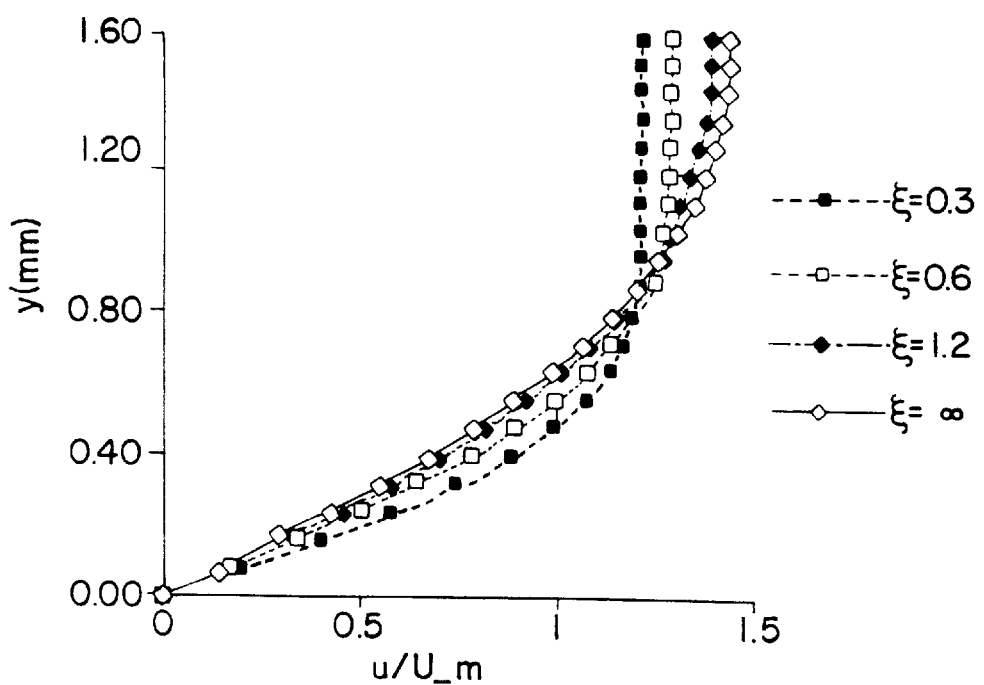
FIG. 37 shows exemplary velocity profiles for flow in a process chamber.

For example, if argon is used at a flow rate of 1000 cc/s, the average flow velocity will be 191 cm/s, and the Reynolds number will be 233. The entry length will be 30 mm. The resulting gas velocity profiles are shown in FIG. 37 for several values $$\zeta = \frac{x}{E} \quad (18)$$

where x is axial distance and E is the entrance length for the flow. In this example, the entrance length is approximately 30 mm. The velocity profiles in FIG. 37 shown the relationship between the ratio of local velocity to average velocity (U/U_m) and distance y from the surface of the flow channel.

According to the method and apparatus of the invention, the inert gas is supplied to the cell 200 in a manner substantially as described previously. Gas is supplied from a gas source and constantly flowed, in the laminar flow regime, over the substrate surface. The flow may be regulated and monitored by any suitable valve regulator and flow meter.

Figure 32:
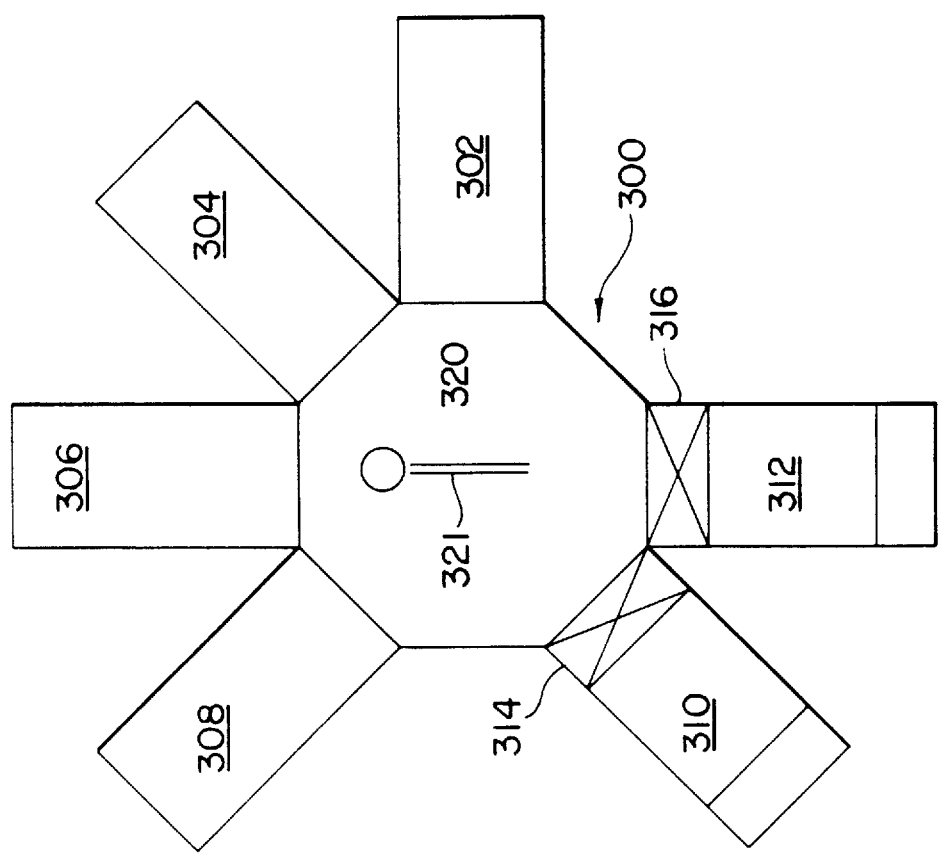
FIG. 32 is a schematic diagram of a cluster tool apparatus used for processing certain substrate articles.

It is understood that various modifications to this embodiment may be contemplated in order to implement the treatment apparatus and method in a commercial environment, especially in connection with the use of the treatment method in a commonly used cluster process tool as shown schematically in FIG. 32.

A typical cluster tool includes a central substrate staging chamber 320 in which the substrate article 321 is held between processing steps. Various processing tool enclosures, 302, 304, 306 and 308 are located around the staging chamber 320 and the article 321 is introduced into each enclosure according to a preprogrammed processing step.

A cleaning process unit may conveniently be positioned in either or both of an inload unit 312 and an outload unit 310, and would embody the treatment apparatus and method using laminar flow. Before the substrate article 321 is introduced into the process chamber 320, cleaning treatment would take place in the inload unit 312. Similarly, cleaning treatment could take place in the outload unit 310 following completion of processing in the process chamber 320.

The process chamber 320 in cluster units usually is typically configured to operate at low vacuum conditions (from sub-atmospheric pressure to 1×10$^{-3}$ torr. It is desirable to minimize gas flow between the central process chamber 320 and the cleaning process unit, which flow may disturb potential contaminants on the walls of either chamber around the interface between them, introducing another source of contaminants. Therefore, it may be commercially preferable to operate the cleaning process unit at the same pressure as the process chamber 320. As noted above, the process described herein may be operated satisfactorily at such pressures.

It is also understood that it may be desirable in various applications to introduce fluid flow aids to control the gas flow conditions (pressure and flow rate) in the chamber while maintaining laminar flow across the substrate surface. In general, the flow rate of gas through the chamber and the static pressure of the gas in the chamber will be governed by the gas pressure and flow rate supplied to the inlet and by the pressure at the outlet.

For example, it is contemplated that gas introduced to the cell inlet 202 from a compressed gas cylinder (as described above) could be supplemented by the use of a gas compressor at that inlet region. This supplementation would allow for the gas to travel through the cell either at a higher static pressure at the same relative velocity or at a higher velocity at the same static pressure than if no supplementation were provided. Similarly, it is contemplated that exhausting of the gas flow through the exhaust port 210 may be supplemented with a vacuum pump connected to the gas outlet region. This will be necessary if the chamber is to be maintained at sub-atmospheric pressure. The outlet and inlet controls could also be combined.

2. Treatment of Irregularly Shaped Surfaces

The embodiments disclosed in FIGS. 2–4 and 27–29 are directed primarily towards the treatment of planar or flat substrates, such as silicon wafers. Accordingly, their application is restricted to those substrate surfaces that may be conveniently secured within a process chamber and configured to permit adequate exposure to a source of radiation emanating from a generally fixed location.

Alternatively, FIGS. 5 through 26 disclose embodiments of the invention capable of removing surface contaminants from objects having irregularly shaped internal and external substrate surfaces or, more specifically, surfaces that lie in non-coincidently related planes. Such planes encompass all possible relationships between the surfaces of a substrate except those occupying the same space or plane. For example, surfaces that are parallel or angularly related, such as opposing interior walls of a pipe or adjacent walls in a cubical chamber, respectively, occupy non-coincidently related planes.

Significantly, the apparatuses disclosed in FIGS. 2–4 and 27–29 are incapable of treating such substrate surfaces. These apparatuses are strictly limited to singularly planar substrates. Conversely, the apparatuses in FIGS. 5 through 26 may effectively treat surfaces occupying non-coincidently related planes either sequentially or simultaneously, as discussed more fully below.

Although not shown in these figures, a gas analyzer 27, such as that described above, and/or particle detector may be incorporated into these embodiments to facilitate selective energy and wavelength adjustment of source 14 as described above. Suitable particle detectors may be obtained from Particle Measuring Systems, Inc. of Boulder, Colo. and Tencor Instruments of Mountainview, Calif.

Figure 5:
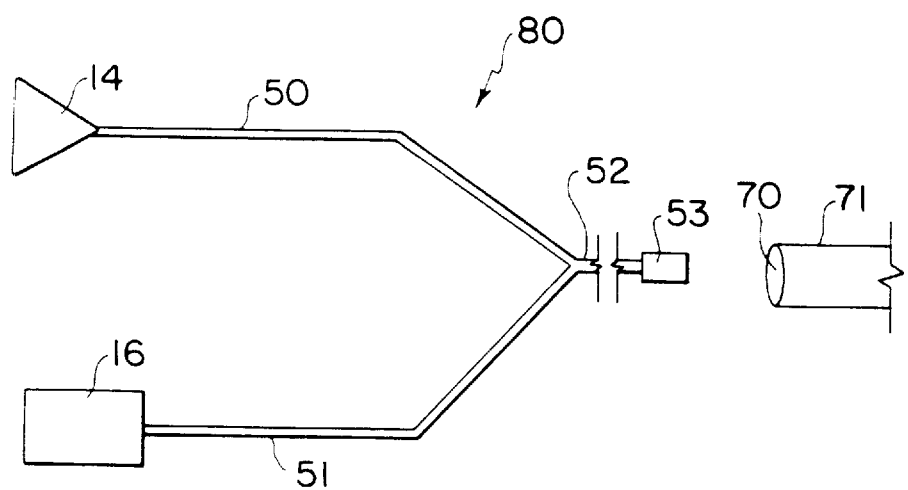
FIG. 5 is a schematic diagram of a contaminant removal apparatus for removing contaminant from irregularly shaped treatment surfaces according to the invention.

FIG. 5 schematically illustrates an apparatus 80 for removing contaminants from elongated enclosed passages, such as pipes 71. Radiation from a radiation source 14 is conducted through a radiation conduit 50, which is an optical waveguide such as a bundle of optical fibers or light pipe, while a gas inert to the substrate treatment surface is conducted from gas source 16 to the treatment surface via gas line 51. Radiation conduit 50 and gas line 51 merge at or before cable head 53, where they may be "bundled" into a single cable 52. Cable head 53, connected to the end of cable 52, includes radiation passages 54 (which may be one or more optical fibers) and gas passages 55. Various configurations of cable head 53 are illustrated in cross section in FIGS. 6–11.

The geometric shape and configuration of radiation passages 54 and gas passages 55 at the end of cable head 53 may be selected based upon the intensity and distribution of radiation and/or gas turbulence required for a particular application (i.e., elongated enclosed passages or more expansive, planar surfaces). For example, FIGS. 6 and 7 disclose configurations that are biased toward enhanced radiation exposure and gas turbulence, respectively. Further, FIGS. 6–9 provide geometries that convey an uneven amount of gas and/or radiation as they repeatedly pass normally over a surface. These are contrasted with the even distribution of gas and radiation provided by FIGS. 10 and 11 when directed normally to a surface. Alternatively, FIGS. 8 and 9 provide a relatively uniform distribution of gas and radiation when applied to surfaces generally parallel to the axis of cable head 53, as discussed more specifically below. Although gas and radiation control is enhanced through the use of cable head 53, it is anticipated that in certain applications this element may be eliminated altogether, allowing gas and radiation to simply emanate directly from the ends of gas conduit 51 and radiation conduit 50.

In addition to facilitating multiple radiation passages 54 and gas passages 55, cable head 53 provides means for redirecting the radiation and gas to substrate treatment surface 70. Such redirection is necessary when apparatus 80 is used for cleaning the interiors of narrow passages such as pipes 71, as shown in FIGS. 12 and 13, where the axis of cable head 53 must be generally parallel to the treatment surface 70.

Figure 15:
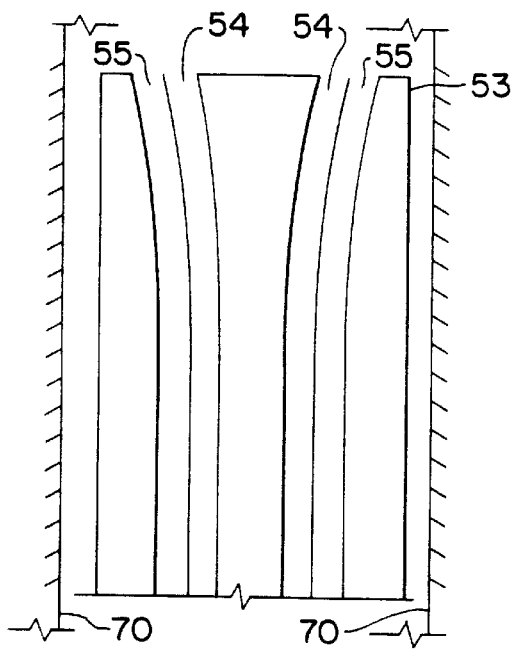
FIG. 15 is a partial plan view of the apparatus illustrated in FIG. 14.
Figure 16:
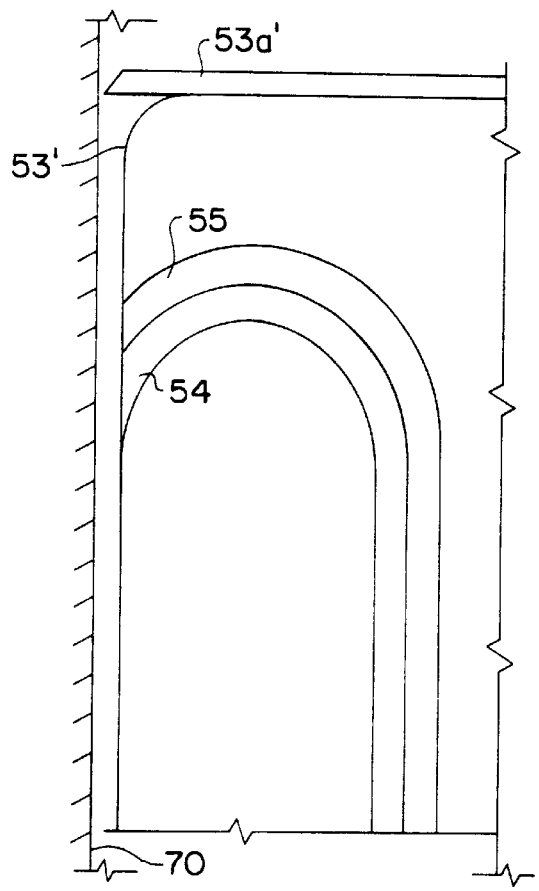
FIG. 16 is a partial plan view of another configuration of an apparatus for conveying gas and radiation to irregularly shaped treatment surfaces according to the principles of the invention.

As shown in FIG. 15, radiation passage 54 and gas passage 55 flare outwardly from the centerline of cable head 53, thereby directing both the radiation and gas flow toward the inner walls of the passage to be cleaned. The angle of the flare from the centerline of cable head 53 may range from few degrees to more than 90° as shown in FIGS. 15 and 16, respectively. The configuration of cable head 53 is application-specific, related to gas flow rate and photon delivery requirements for contaminant removal. More specifically, cable head 53 directs radiation at the appropriate density and angle of incidence for a particular contaminant and substrate while maintaining a continuous flow of inert gas across that portion of the substrate being irradiated.

Figure 12:
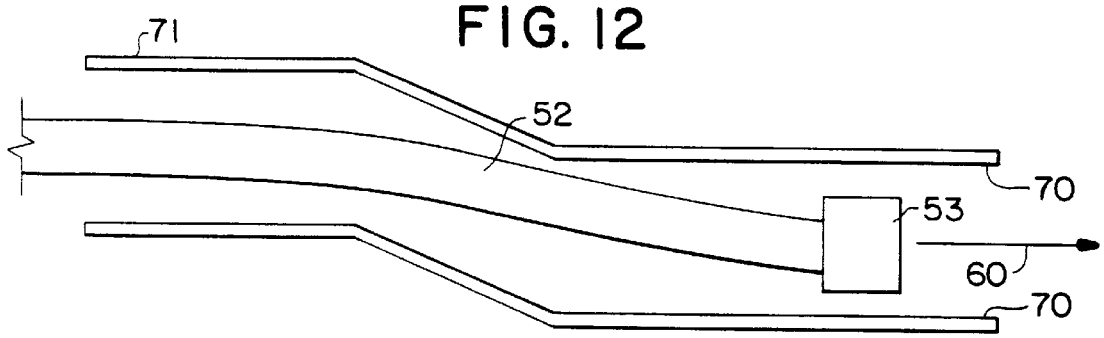
FIGS. 12 and 13 are schematic side views showing how the invention of FIG. 5 may be applied to remove contaminant from the interiors of elongated, enclosed passages.
Figure 13:
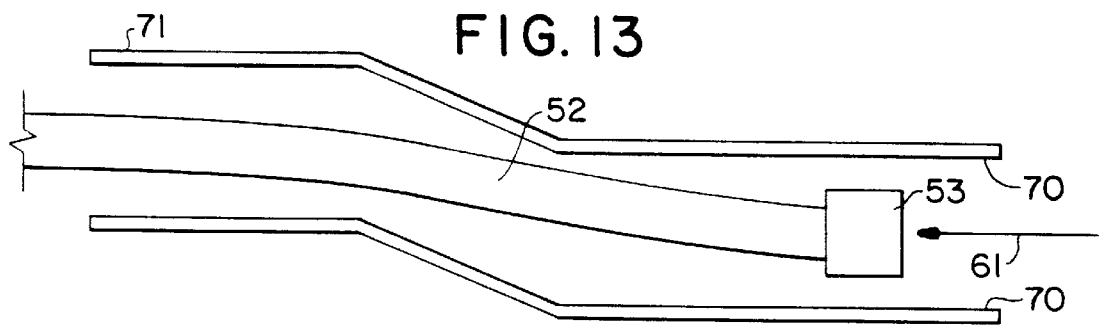

In operation, apparatus 80, and more specifically cable 52 and cable head 53, may traverse an elongated, enclosed passage 71 in either a forward or reverse direction, as shown in FIGS. 12 and 13, respectively. When moving forward, as denoted by arrow 60 in FIG. 12, cable head 53 may be configured as shown in FIG. 15. Radiation passage 54 and gas passage 55 may be disposed in the inner and outer passages, respectively, of cable head 53. In this way, the irradiation of substrate surface 70 from energy conveyed through radiation passage 54 will occur downstream from the flow of gas emanating from the discharge end of gas passage 55, and any dislodged contaminants will be continually pushed ahead of cable head 53 by discharged gas as the cable head moves forward.

Alternatively, cable head 53 may move in a reverse or backward direction denoted by arrow 61 of FIG. 13. When moving backwardly, cable head 53' may be configured as shown in FIG. 16. Radiation passage 54 and gas passage 55 may be disposed in the outer and inner passages, respectively, of cable head 53'. Gas discharged from gas passage 55 flows back along cable 52 in the annular space between the cable and pipe 71. In this way, the portion of substrate surface 70 being irradiated by energy conducted through radiation passage 54 will be blanketed by the gas, and any dislodged contaminants will be continually pushed by gas in the direction of movement of cable head 53' as the cable head moves backwardly along the pipe. To prevent contaminant-laden gas from passing into the portion of the pipe already treated, a cap may be placed at the end of the pipe nearest the portion first treated. Alternatively, a cap 53a', as illustrated in FIG. 16, may be mounted on the end of the cable head 53'. This cap has an outside diameter slightly less than the inside diameter of pipe 71, so that the annular flow area between the cap and the pipe is much less than the annular flow area between pipe 71 and cable 52 or cable head 53'. The gas will therefore flow away from cap 53a' and toward cable 52.

Figure 14:
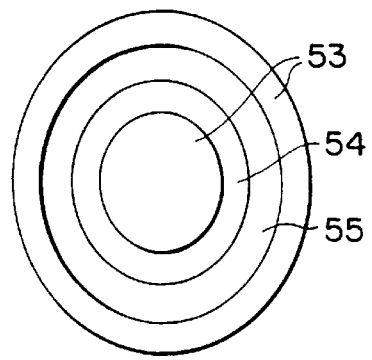
FIG. 14 is an schematic end view of an apparatus for conveying gas and radiation to irregularly shaped treatment surfaces according to the principles of the invention.

In both forward and backward moving configurations, the constant flow rate of the inert gas discharged from gas passage 55 is sufficient to move the contaminants away from the area of treatment. This flow of gas may also serve as a means for centering cable head 53 within elongated enclosed passages to be cleaned. As shown in FIGS. 14–16, gas passage 55 may be configured as an annular ring directed outwardly from the centerline of cable 52. Should sufficient gas pressure be applied, the uniform, outwardly directed gas from gas passage 55 may center cable head 53 within an elongated, enclosed passage.

Alternatively, flexible, porous support structure 56, composed of a stable and non-particle shedding material, may be placed around cable head 53 for centering purposes, as shown in FIGS. 17 and 17a. To avoid contaminating cleaned surfaces, support structure 56 should never contact treated surfaces, whether cable head 53 moves in a forward (arrow 60) or reverse (arrow 61) direction. Thus, support structure 56 should pass over the substrate surface ahead of the radiation treatment. In such an application, the structure must be sufficiently porous to allow gas and dislodged contaminant to flow through it as cable head 53 traverses the enclosed passage. In the forward moving embodiment shown in FIG. 17, gas passages 55 and radiation passages 54 (not shown) may exit from the side of cable head 53 rather than from its face as illustrated in FIGS. 14 and 15 to enable installation of support structure 56 downstream of gas and contaminant flow.

Where the interior of an elongated, enclosed passage is constructed from sufficiently reflective material, such as basic annealed 316 stainless steel, a high-energy lamp, or radiation conduit 50 with an optical diffuser 57 mounted to its end, may simply emit radiation 11 at the entrance to the passage and allow resulting radiation 11 to reflectively traverse the interior 70', as shown in FIG. 18. The interior 70' of elongated passage 71' is sufficiently reflective to enable radiation 11 to traverse the interior without moving the source of radiation. Inert gas flow 18, conveyed to the entrance of passage 71' by any means known in the art, ensures particulate is moved downstream once dislodged from substrate surface 70'. In addition, reflector 58, which may also be constructed from 316 stainless steel, is secured to the perimeter of the entrance of passage 71' to prevent back flow of radiation and gas.

It is also anticipated that a liquid, rather than a gas, may serve as the inert medium to carry away contaminants dislodged through irradiation from narrow, elongated passages. Such a modification would be particularly useful in the removal of plaque from the interior walls of blood vessels. In such an application, the applied radiation would be characterized by an energy density and duration between that required to release surface contaminants from the treatment surface and that which would damage or traumatize the composition of the vascular structure.

Analogous to elongated, enclosed passages, apparatus 80, or more particularly cable 52 and cable head 53, may be utilized to clean more expansive interiors such as those of process chambers. In such instances, cable head 53 may be configured without a flare, so that radiation and inert gas are directed straight out the end of the cable along the cable axis. Manual or robotic control may be employed to guide the assembly as it sweeps across such surfaces.

Figure 19:
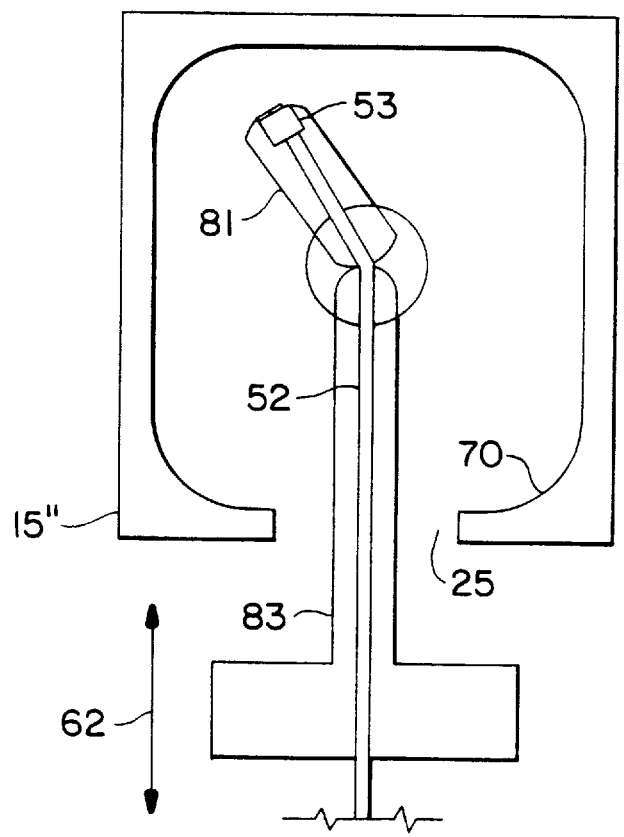
FIGS. 19 and 20 are schematic side views showing how the invention of FIG. 5 may be applied to remove contaminant from process chamber interiors.

In FIG. 19, for example, chamber 15" includes a gas inlet embodied in gas passage 55 of cable head 53, and gas outlet 25. Within the chamber, robotic arm 81 attached to base 83 provides means for moving cable head 53 about the interior walls of the chamber, identified as substrate treatment surface 70. The arm may spin a complete 360°, and base 83 may move up and down as denoted by arrow 62 providing complete access to the interior of the chamber. As radiation and gas are conveyed to substrate treatment surface 70 by means of passages 54 and 55 of cable head 53, contaminant is dislodged from the surface and is drawn to outlet 25 by means of gravity and gas flow.

Figure 20:
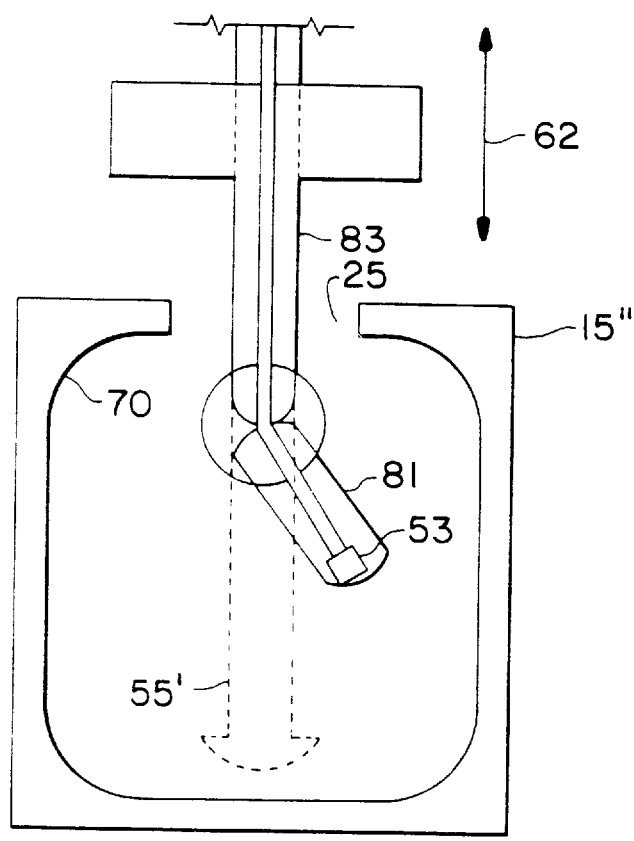

Alternatively, FIG. 20 illustrates a chamber cleaning arrangement wherein the gas outlet 25 is positioned at the top of the chamber. As in FIG. 19, robotic arm 81 attached to base 83 provides means for moving cable head 53 about the interior walls of the chamber. In this instance, however, gravity may not be relied upon to draw dislodged contaminant toward gas outlet 25. As such, a secondary gas flow is provided as indicated by arrow 55' to maintain a constant turbulence at the base of chamber 15". This secondary flow creates constant movement of gas toward outlet 25 extending the full depth of the chamber. Accordingly, as the substrate surface 70 is cleaned from bottom to top, contaminant is carried by the upward flowing gas stream produced by secondary flow 55' and expelled through outlet 25. It is anticipated that one or more secondary sources of gas may be added to chamber 15" to accommodate different chamber geometries and gas outlet positions (i.e., side mounting).

In addition to interiors, cable 52 and cable head 53 may be used to remove contaminant from exteriors of irregularly shaped objects. For example, in FIG. 21, chamber 15' is fitted with gas inlets 23 and outlets 25 to enable a bulk gas flow 18 to traverse the chamber. Within the chamber, robotic arm 81 attached to base 82 provides means for moving cable head 53 about object 72, which includes substrate treatment surface 70. Access to the entire surface 70 of object 72 is facilitated by turntable 84. Passages 54 and 55 within cable head 53 convey radiation and sufficient gas flow to the specific area being treated so to dislodge contaminant from substrate surface 70. Once dislodged from the treatment area, contaminant enters the bulk flow gas stream 18 and is removed from chamber 15' via gas outlet 25. As mentioned above, this exiting gas may be monitored through the use of a gas analyzer and/or particle detector to facilitate selective energy and wavelength adjustment of radiation source 14 (not shown).

Figure 21:
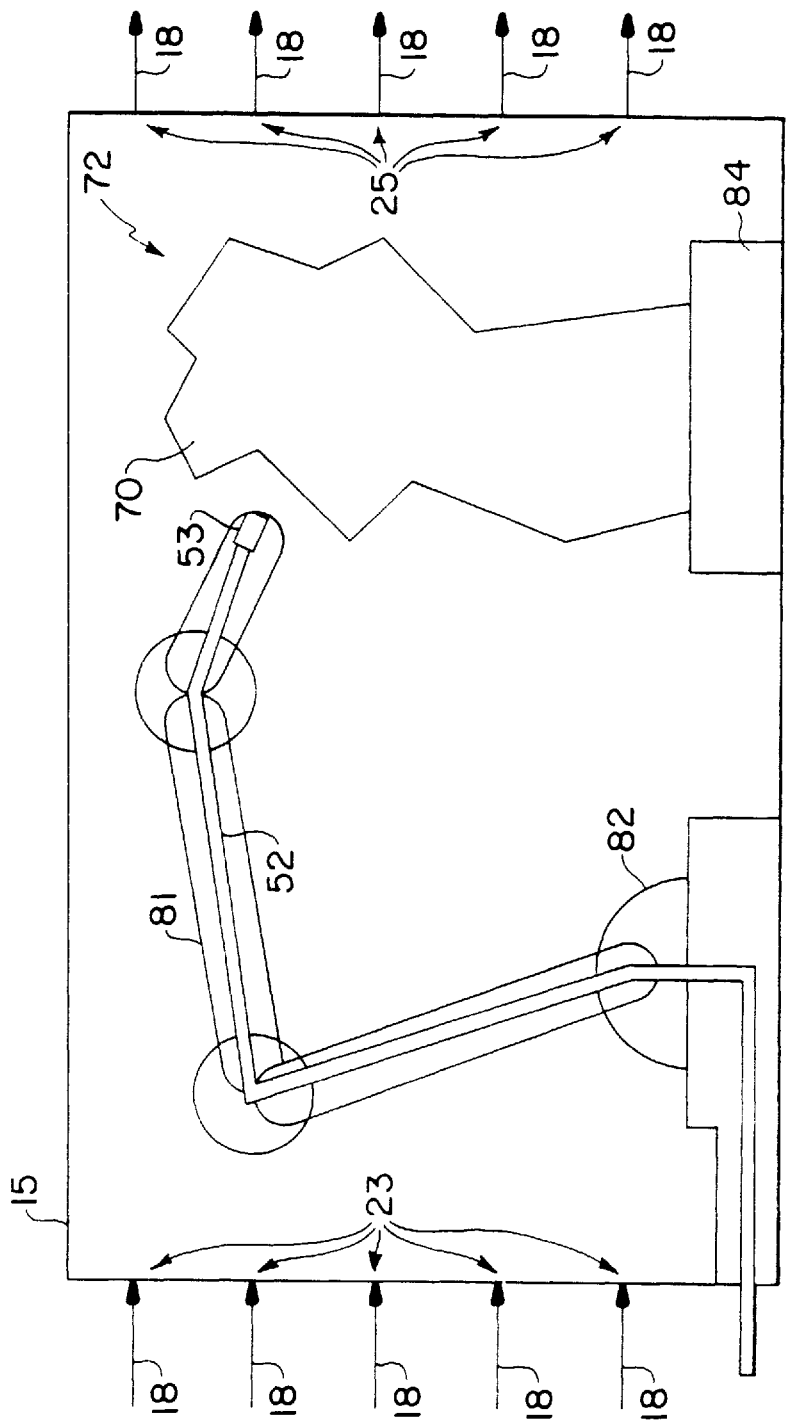
FIGS. 21 and 22 are schematic side views showing how the invention of FIG. 5 may be applied to remove contaminant from the exteriors of irregularly shaped objects.
Figure 22:
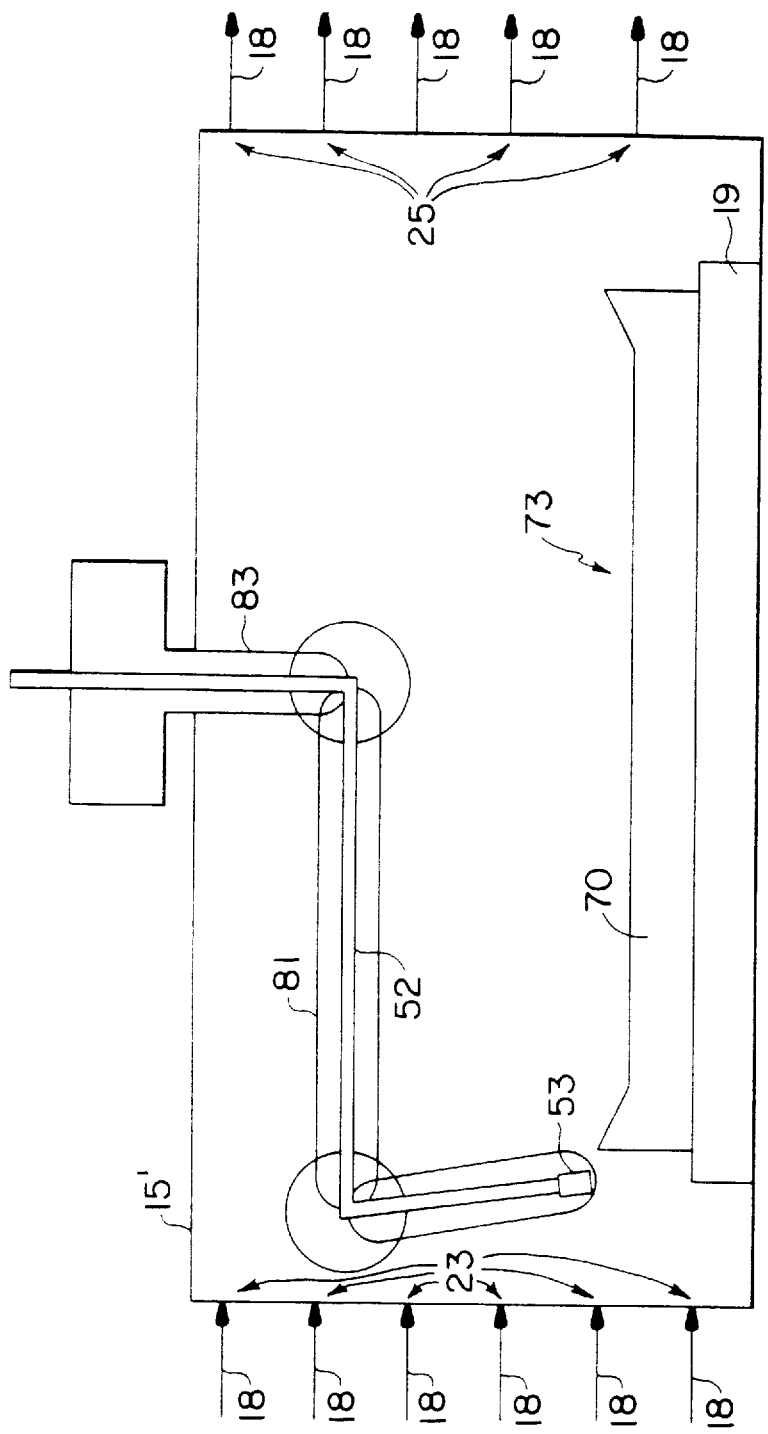

The principles in FIG. 21 apply equally to FIG. 22 wherein object 73 includes a more planar substrate treatment surface 70 such as that found on a painting.

It is anticipated that the exteriors of irregularly shaped objects may be successfully treated through the foregoing process without the use of a chamber, relying solely on gas supplied by conduit 51. Such an apparatus may be in the form of a hand-held device wherein sufficient decontamination is measured by visual inspection rather than through a gas analyzer and/or particle detector.

Figure 23:
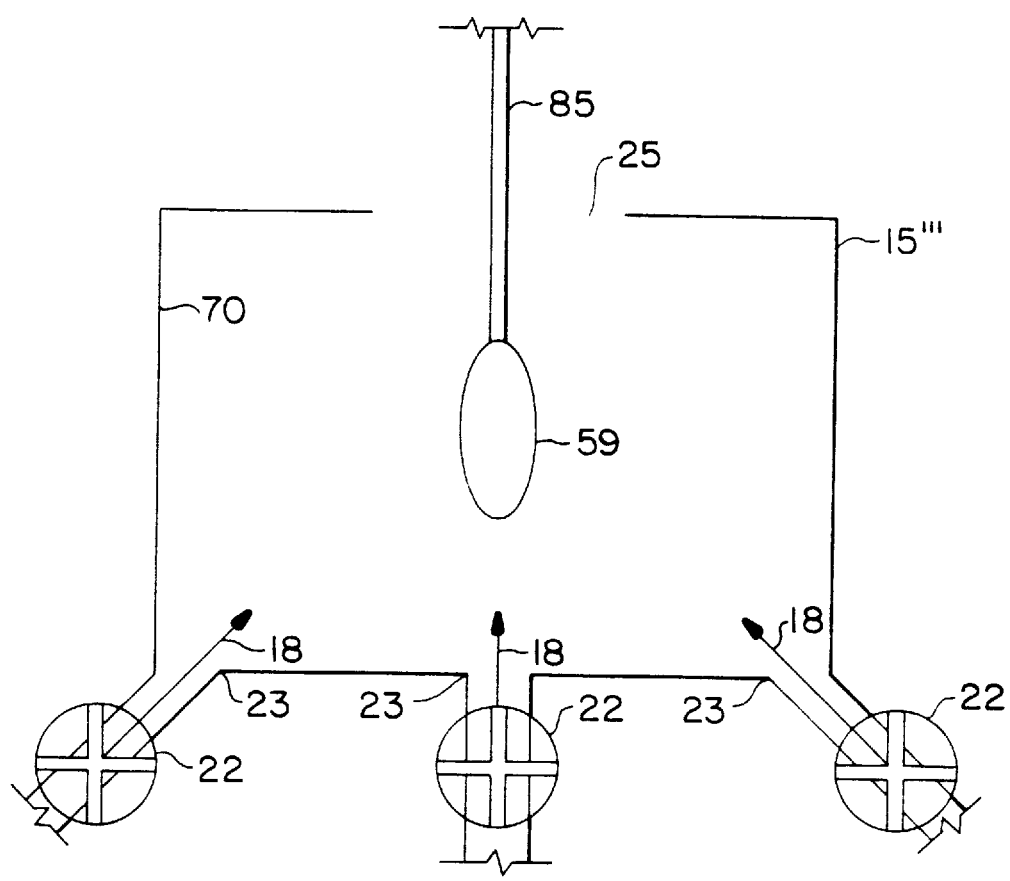
FIGS. 23 and 24 are schematic side views showing how radiation is applied in another embodiment of the invention to remove contaminant from ducted interiors.
Figure 24:
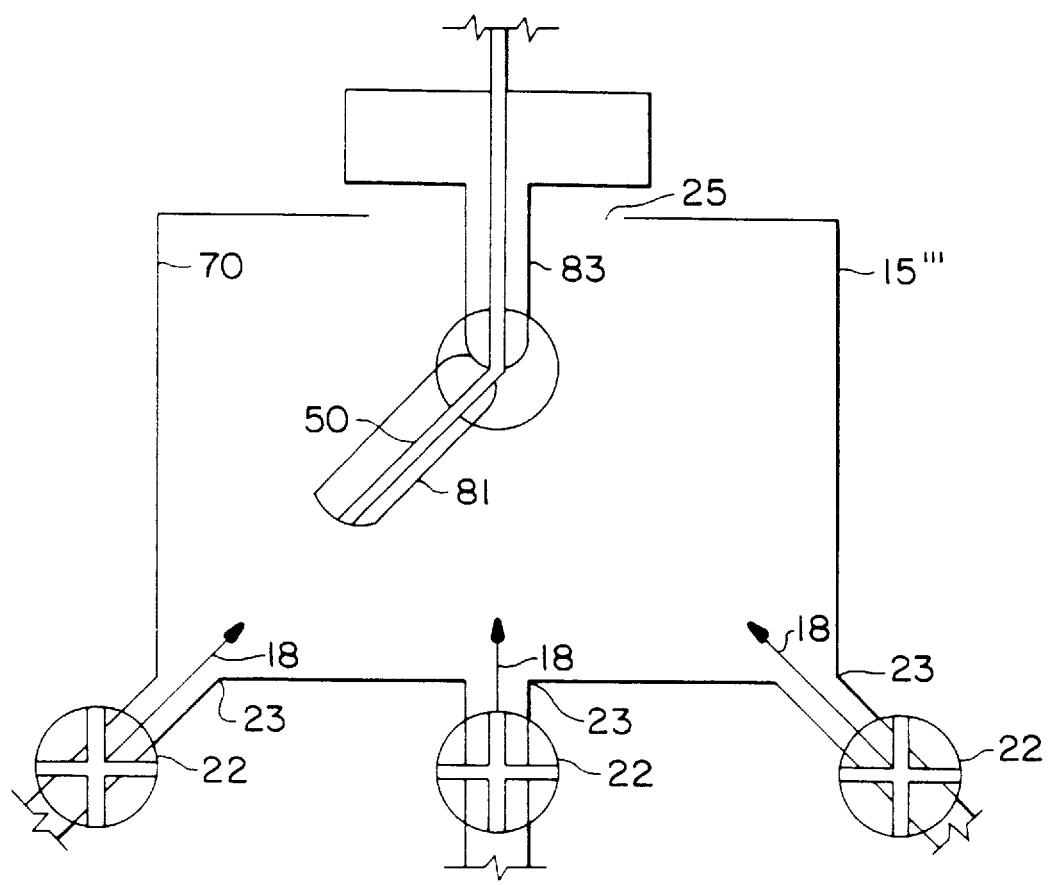

In some irregularly shaped surface applications, it may be advantageous to alter apparatus 80 by separating the gas from the radiation transmission means altogether. For example, when removing contaminants from the interior of a process chamber, one or more radiation sources, such as an ultraviolet lamp, may be placed within the chamber via support 85 as shown in FIG. 23. As the ultraviolet lamp irradiates the chamber interior 70 (substrate treatment surface), gas 18 may be provided from one or more inlets 23 to expel dislodged contaminant from the chamber 15''' via outlet 25. Gas flow 18 may be controlled by valves 22 as described above. Alternatively, radiation may be conveyed to the interior of chamber 15''' via conduit 50 and robotic arm 81 as shown in FIG. 24.

Figure 26:
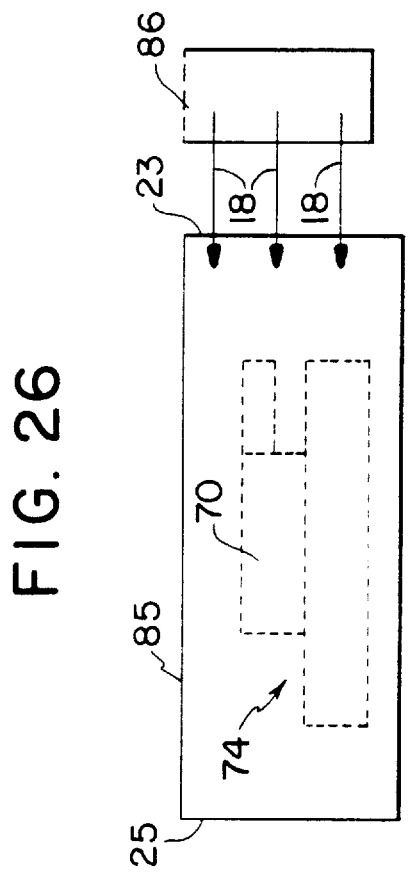
FIGS. 25 and 26 are schematic end and side views, respectively, showing how radiation is applied in another embodiment of the invention to remove contaminants from the exteriors of irregularly shaped objects.
Figure 25:
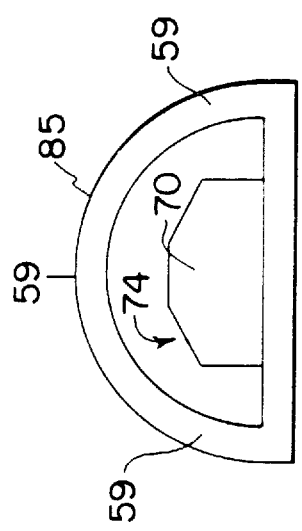

Finally, as illustrated in FIGS. 25 and 26, radiation may be generated by means of a bank of high-energy lamps 59 which essentially bathe the substrate treatment surface 70 of object 74 with a sufficient level of radiation to dislodge contaminant. Object 74, which may be an armored vehicle, is exposed to lamps 59 within "Quonset" hut 85, while inert gas 18, accelerated by fan 86, flows over the substrate surface 70. Where geometrically shielded areas may escape the gas turbulence created by fan 86 or radiation generated by bank 59, one or more apparatuses 80 (not shown) may be employed to access these areas.

3. Treatment Supplemented by Forces of Gravity

In another embodiment of the apparatus and method of the invention, it is contemplated that certain advantages are gained by providing structure that allows the substrate article to be retained in an inverted position during treatment. In general, when a contaminant is dislodged from a substrate surface, the inert gas flow will tend to carry the contaminant away, and avoiding gas flow conditions that would impart a velocity component to the contaminant that is normal to the substrate surface will reduce the chance that the contaminant will be redeposited on the substrate. However, if the substrate is disposed with the surface to be treated being uppermost, the force exerted by gravity on a dislodged contaminant will be toward the substrate surface, tending to promote redeposition. Thus, it will generally be preferable to mount the substrate so that a dislodged contaminant will tend to fall away from the substrate rather than toward it. However, it is understood that mounting the substrate in an inverted position may be undesirable when manufacturing or other process factors are considered.

Referring to FIG. 33, it is commonly understood that a substrate article 301 may often include a number of wells or cavities 305 in which contaminants 303 may be lodged. Such substrates are particularly suited to mounting in an inverted position so that gravity will act to avoid redeposition. In the same manner as previously discussed, a flow 307 of inert gas is provided to the treatment surface along with irradiation 309 from the radiation source 313. The irradiation passes through a quartz window 311. Of course, some means must be provided to retain the substrate in the inverted position, such as the vacuum channel 216 illustrated in FIG. 27.

It will be apparent that as the aspect ratio (depth to width) of a cavity 305 is increased, less of the inert gas flow will penetrate to the floor of the cavity to aid in removing contaminants. Thus, it is also contemplated to introduce a secondary inert gas 315 flow to the primary inert gas flow 307 during treatment of the article 301 when mounted inverted as depicted in FIGS. 34 and 35. The secondary inert gas flow 315 may be introduced substantially perpendicularly to the plane of the substrate article 301 such that the additional fluid flow aids the irradiation effect and the primary gas flow 307 to dislodge the contaminants 303 from the wells or cavities 305. The flow is not to reach a flow velocity that would disrupt the primary flow 307 to such a degree as to create a non-laminar (i.e., turbulent) flow condition. As shown in FIG. 41, it is anticipated that the secondary flow 315 will induce a streamline 325 of the flow through the cavity 305 that will generally follow the walls of the cavity. Although this could be considered to involve recirculation, and the flow has a velocity component normal to the plane of the overall substrate, when viewed locally it should in fact have a relatively small component normal to the walls and floor of the cavity. Thus, the flow should aid removal of contaminants and not promote redeposition.

The secondary flow 315 can be introduced at any angle optimally determined to best aid in dislodging the contaminants 303. Similarly, as described above, it may be preferred to orient the incident radiation 309 at an angle to the plane of the substrate so as to illuminate the walls of the cavity at an angle as near to normal as possible, thus enhancing the removal of contaminants from the walls. Of course, the incident angle will be dictated by the aspect ratio of the cavity.

What is claimed is:

1. A method for removing surface contaminants from a treatment surface of a substrate while preserving the crystal structure of the surface being treated, comprising the steps of:

introducing across said treatment surface a flow of gas inert to the treatment surface, said gas flow having a velocity vector substantially parallel to said treatment surface at substantially all points over said treatment surface; and irradiating said treatment surface with high-energy irradiation, said irradiation having an energy density and duration sufficient to release surface contaminants from the treatment surface and insufficient to alter the crystal structure of the treatment surface, wherein said gas flow originates from a gas flow that is forced through a flow straightener located upstream of said treatment surface to generate a velocity profile that is substantially uniform across the exit plane of said flow straightener.

2. A method according to claim 1 wherein said flow straightener comprises a filter assembly.

3. A method according to claim 2, wherein said gas flow originates from a gas flow that is introduced into a mixing chamber disposed upstream of said filter assembly.

4. A method for removing surface contaminants from a treatment surface of a substrate while preserving the crystal structure of the surface being treated, comprising the steps of:

placing said treatment surface in a flow channel in a manner such that said treatment surface is upside down relative to gravitational forces;

introducing across said treatment surface a flow of gas inert to the treatment surface, said gas flow having a velocity vector substantially parallel to said treatment surface at substantially all points over said treatment surface; and irradiating said treatment surface with high-energy irradiation, said irradiation having an energy density and duration sufficient to release surface contaminants from the treatment surface and insufficient to alter the crystal structure of the treatment surface.

5. A method for removing surface contaminants from a treatment surface of a substrate while preserving the crystal structure of the surface being treated, comprising the steps of:

placing the substrate in a recess formed in a flow channel such that the treatment surface is flush with the surface of said flow channel;

introducing across said treatment surface and into said flow channel a flow of gas inert to the treatment surface; and irradiating said treatment surface with high-energy irradiation, said irradiation having an energy density and duration sufficient to release surface contaminants from the treatment surface and insufficient to alter the crystal structure of the treatment surface.

6. A method according to claim 5, wherein the substrate is restrained in said recess by vacuum.

7. A method according to claim 5, wherein said gas flow of a planar inlet region of said flow channel has a velocity profile that is substantially uniform across the plane of said inlet region.

8. A method for removing surface contaminants from a treatment surface of a substrate while preserving the crystal structure of the surface being treated, comprising the steps of:

introducing across said treatment surface a main flow of gas inert to the treatment surface;

introducing into said flow channel a secondary flow of gas inert to said treatment surface, said secondary gas flow being introduced at an angle to said main gas flow; and irradiating said treatment surface with high-energy irradiation, said irradiation having an energy density and duration sufficient to release surface contaminants from the treatment surface and insufficient to alter the crystal structure of the treatment surface.

9. The method of claim 8 wherein the treatment surface is substantially planar but includes cavities therein, said secondary gas flow interacting with said main gas flow to induce a resultant flow into the treatment surface cavities to carry away dislodged contaminants therein.

\* \* \* \* \*